United States Patent
Sekine

(10) Patent No.: US 12,317,611 B2
(45) Date of Patent: May 27, 2025

(54) PHOTOELECTRIC CONVERSION ELEMENT AND PHOTOELECTRIC CONVERSION DEVICE

(71) Applicant: CANON KABUSHIKI KAISHA, Tokyo (JP)

(72) Inventor: Hiroshi Sekine, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 462 days.

(21) Appl. No.: 18/051,677

(22) Filed: Nov. 1, 2022

(65) Prior Publication Data
US 2023/0163229 A1 May 25, 2023

(30) Foreign Application Priority Data
Nov. 25, 2021 (JP) .................. 2021-191170

(51) Int. Cl.
*H10F 30/222* (2025.01)
*H10F 30/225* (2025.01)
*H10F 77/20* (2025.01)
*H10F 77/40* (2025.01)

(52) U.S. Cl.
CPC ......... *H10F 30/222* (2025.01); *H10F 30/225* (2025.01); *H10F 77/206* (2025.01); *H10F 77/413* (2025.01)

(58) Field of Classification Search
CPC .... H10F 30/222; H10F 30/225; H10F 77/206; H10F 77/413
See application file for complete search history.

(56) References Cited

U.S. PATENT DOCUMENTS

| 10,009,560 B2 | 6/2018 | Kobayashi |
| 10,186,532 B2 | 1/2019 | Kobayashi |
| 10,205,894 B2 | 2/2019 | Kawabata |
| 10,483,307 B2 | 11/2019 | Sekine |

(Continued)

FOREIGN PATENT DOCUMENTS

| JP | 2018-64086 A | 4/2018 |
| JP | 2018-88488 A | 6/2018 |

OTHER PUBLICATIONS

U.S. Appl. No. 17/886,552, filed Aug. 12, 2022 by Daiki Shirahige.
(Continued)

*Primary Examiner* — Suberr L Chi
(74) *Attorney, Agent, or Firm* — VENABLE LLP

(57) ABSTRACT

A photoelectric conversion element provided in a semiconductor layer having first and second surfaces includes a first region of a first conductivity type, a second region of a second conductivity type closer to the second surface than the first region and forming a p-n junction with the first region, a third region of the first conductivity type closer to the second surface than the second region, a fourth region of the second conductivity type closer to the second surface than the third region, a fifth region of the second conductivity type between the third fourth regions, and a sixth region of the second conductivity type surrounding a region where the first, second, third, and fifth regions are disposed in a plan view. The fifth region has an area smaller than that of the third region in the plan view, and overlaps with the first region in the plan view.

22 Claims, 26 Drawing Sheets

(56) References Cited

U.S. PATENT DOCUMENTS

| | | |
|---|---|---|
| 10,535,688 B2 | 1/2020 | Onuki |
| 10,645,322 B2 | 5/2020 | Sekine |
| 10,771,718 B2 | 9/2020 | Kawabata |
| 10,805,563 B2 | 10/2020 | Ikeda |
| 10,848,695 B2 | 11/2020 | Miki |
| 11,056,520 B2 | 7/2021 | Onuki |
| 11,297,273 B2 | 4/2022 | Sekine |
| 2022/0037380 A1 | 2/2022 | Shinohara |
| 2022/0093662 A1 | 3/2022 | Shinohara |
| 2023/0090385 A1* | 3/2023 | Morimoto ............. H10F 39/805 257/438 |

OTHER PUBLICATIONS

U.S. Appl. No. 18/145,072, filed Dec. 22, 2022 by Hiroshi Sekine.
U.S. Appl. No. 18/145,076, filed Dec. 22, 2022 by Hiroshi Sekine.
U.S. Appl. No. 18/148,595, filed Dec. 30, 2022 by Hiroshi Sekine.
U.S. Appl. No. 18/147,079, filed Dec. 28, 2022 by Hiroshi Sekine.
U.S. Appl. No. 17/858,098, filed Jul. 6, 2022 by Hiroshi Sekine.

* cited by examiner

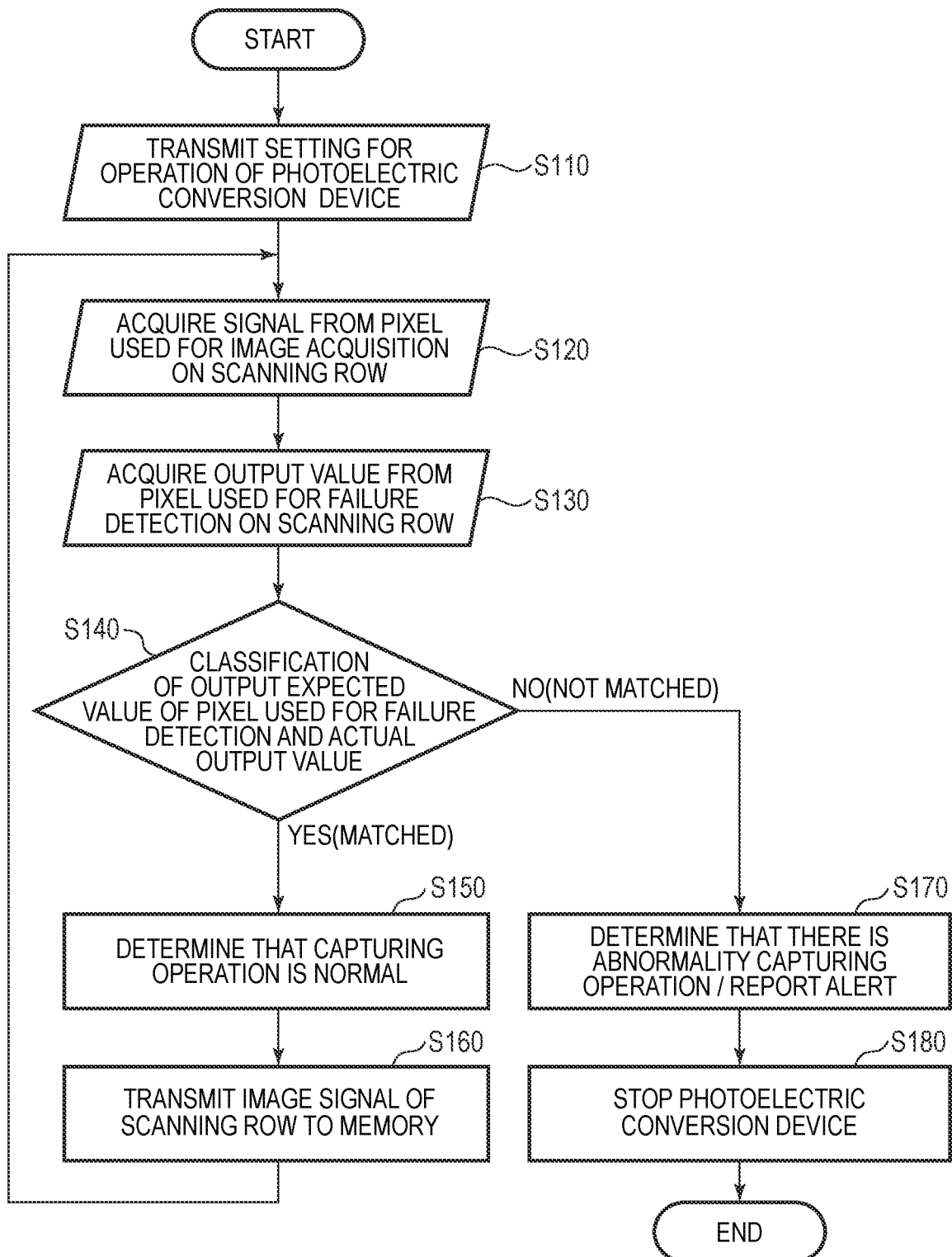

PHOTOELECTRIC CONVERSION ELEMENT AND PHOTOELECTRIC CONVERSION DEVICE

BACKGROUND OF THE INVENTION

Field of the Invention

The present invention relates to a photoelectric conversion element and a photoelectric conversion device.

Description of the Related Art

As photoelectric conversion elements, APD (Avalanche Photo Diode) and SPAD (Single Photon Avalanche Diode) in which charge generated by incidence of photon is multiplied by avalanche breakdown are known. Japanese Patent Application Laid-Open No. 2018-088488 and Japanese Patent Application Laid-Open No. 2018-064086 disclose photoelectric conversion elements in which an n-type semiconductor region is arranged in an n-well of a photoelectric conversion region so as to be in contact with a p-type semiconductor region forming an avalanche multiplication region in order to easily collect generated charges in an avalanche multiplication region.

In a sensor requiring high-speed response such as a photoelectric conversion device having a distance measuring function of a ToF (Time of Flight) system, it is required to minimize variation in the collection time of charges generated by incidence of photons. However, the photoelectric conversion elements described in Japanese Patent Application Laid-Open No. 2018-088488 and Japanese Patent Application Laid-Open No. 2018-064086 are not necessarily preferable from the viewpoint of reducing variation in the collection time of charges generated by incidence of photons.

SUMMARY OF THE INVENTION

An object of the present invention is to provide a photoelectric conversion element and a photoelectric conversion device excellent in high-speed response.

According to an embodiment of the present disclosure, there is provided a photoelectric conversion element provided in a semiconductor layer having a first surface and a second surface opposed to the first surface including a first semiconductor region of a first conductivity type, a second semiconductor region of a second conductivity type disposed closer to the second surface than the first semiconductor region and forming a p-n junction with the first semiconductor region, a third semiconductor region of the first conductivity type disposed closer to the second surface than the second semiconductor region and overlapping with the first semiconductor region and the second semiconductor region in a plan view, a fourth semiconductor region of the second conductivity type disposed closer to the second surface than the third semiconductor region and overlapping with the whole of a region where the first semiconductor region, the second semiconductor region, and the third semiconductor region are disposed in the plan view, a fifth semiconductor region of the second conductivity type disposed at a depth between the third semiconductor region and the fourth semiconductor region, and a sixth semiconductor region of the second conductivity type disposed so as to surround a region where the first semiconductor region, the second semiconductor region, the third semiconductor region, and the fifth semiconductor region are disposed in the plan view, and electrically connected to the fourth semiconductor region, wherein the fifth semiconductor region has an area smaller than an area of the third semiconductor region in the plan view and overlaps with the first semiconductor region in the plan view.

Further features of the present invention will become apparent from the following description of exemplary embodiments with reference to the attached drawings.

BRIEF DESCRIPTION OF THE DRAWINGS

FIG. 25 is a flowchart illustrating the operation of the photodetection system according to the ninth embodiment of the present invention.

DESCRIPTION OF THE EMBODIMENTS

Figure 1:
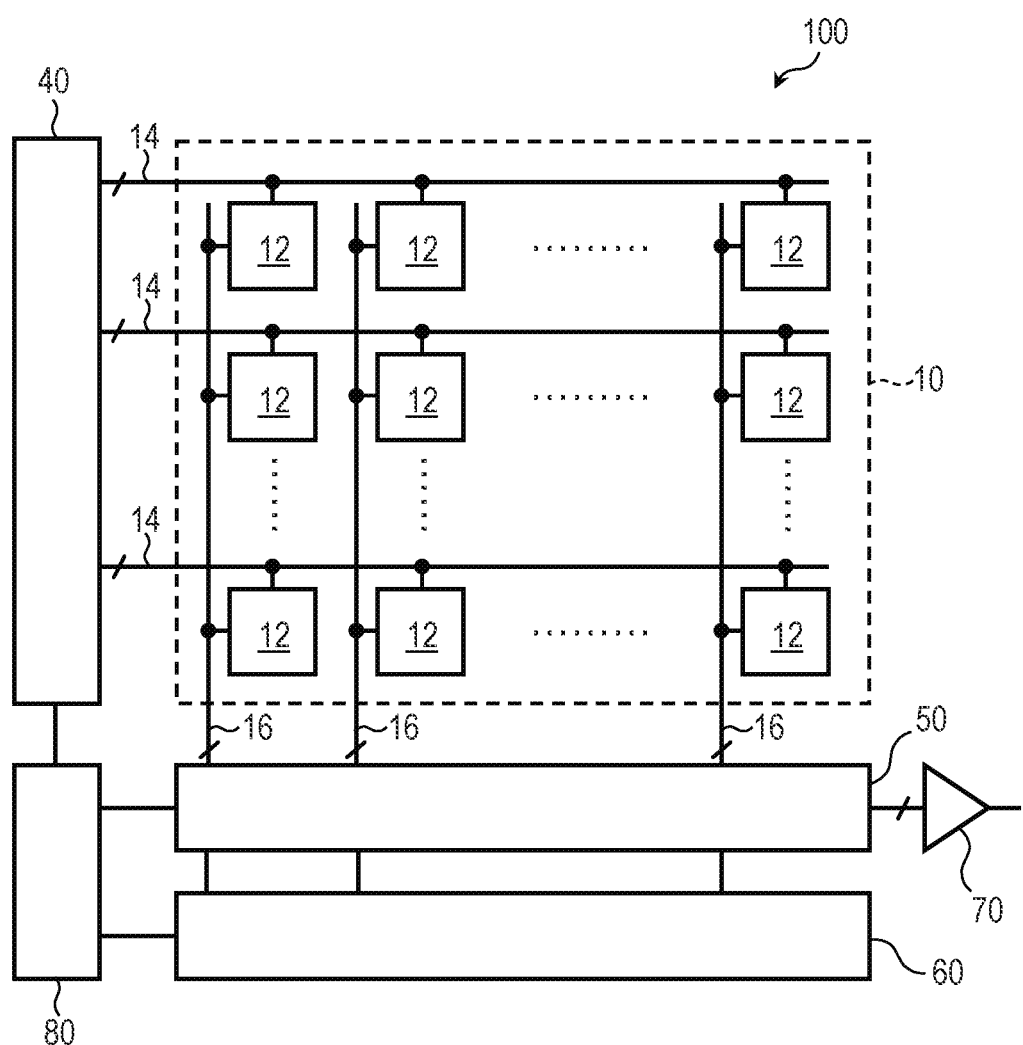
FIG. 1 and FIG. 2 are block diagrams illustrating a schematic configuration of a photoelectric conversion device according to a first embodiment of the present invention.

Preferred embodiments of the present invention will now be described in detail in accordance with the accompanying drawings. The following embodiments are for embodying the technical concept of the present invention and are not limited thereto to. The sizes and positional relationships of the members illustrated in the drawings may be exaggerated for clarity of explanation. In the following description, the same components are denoted by the same reference numerals, and description thereof may be omitted.

First Embodiment

Figure 2:
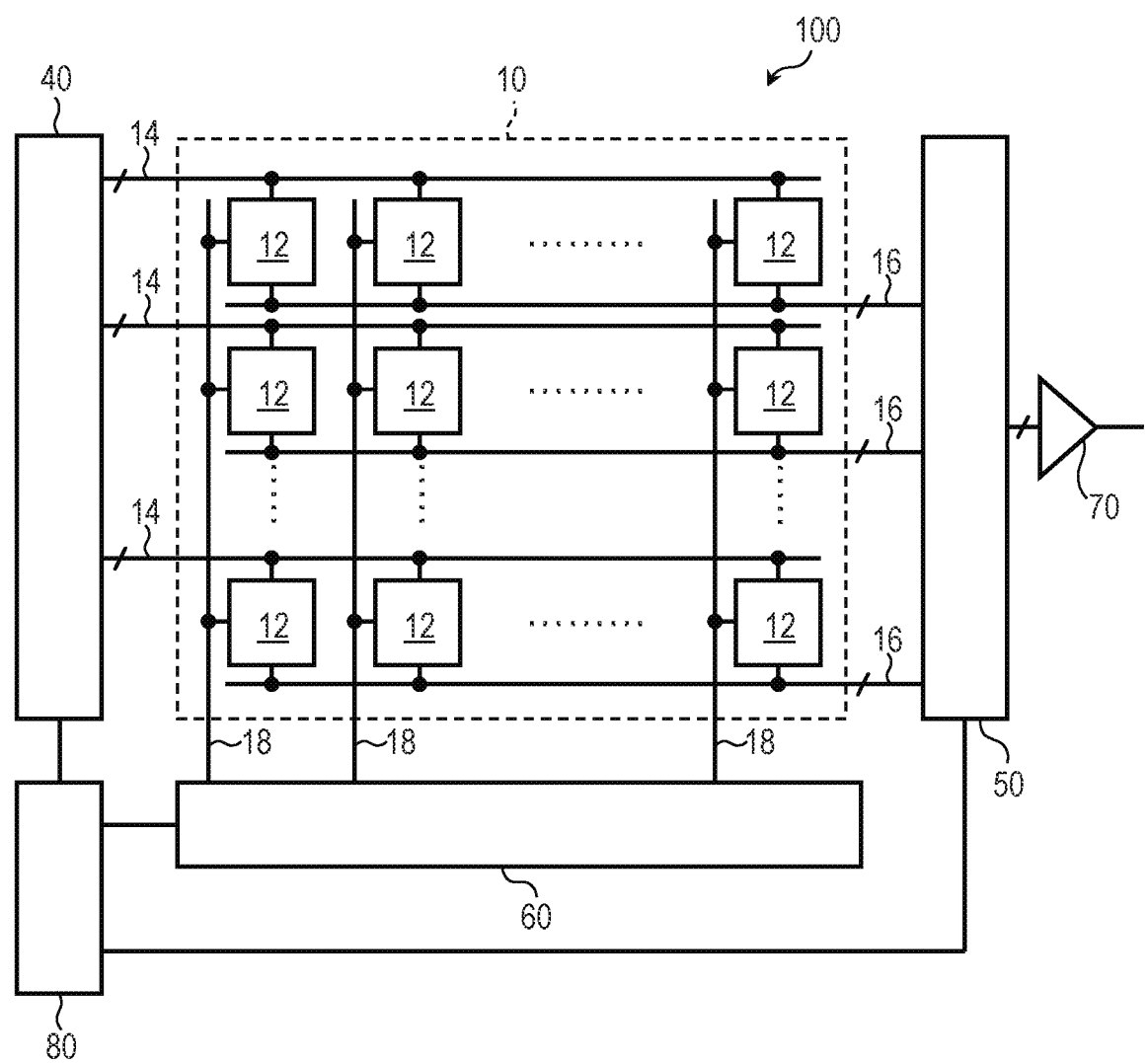
Figure 3:
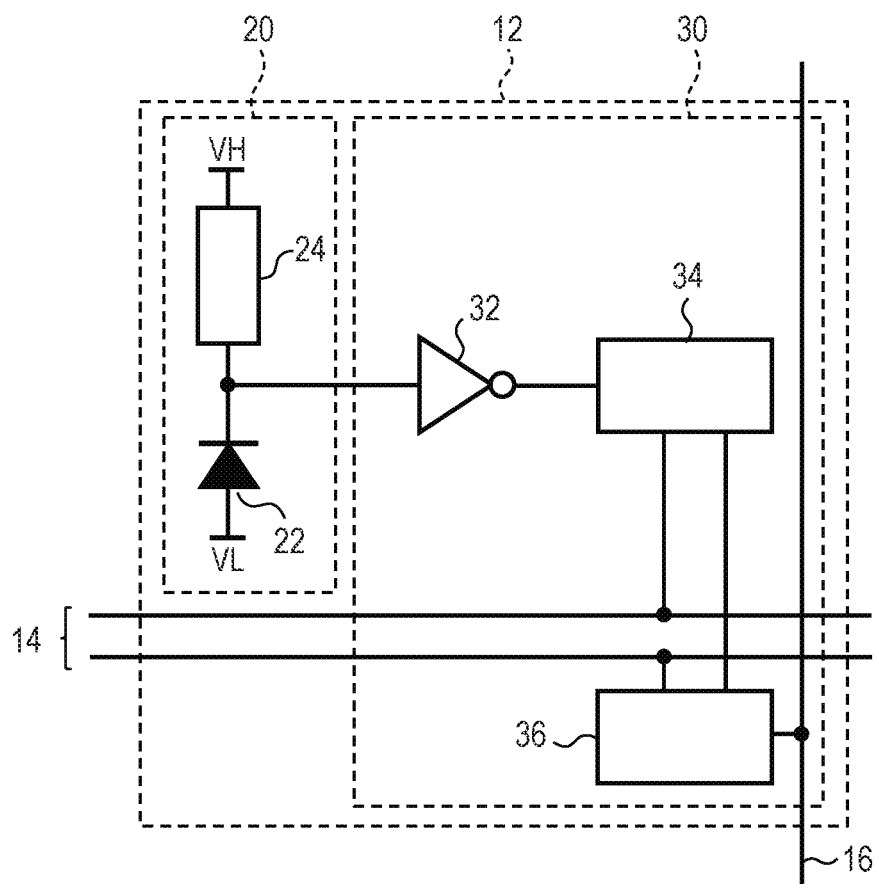
FIG. 3 is a block diagram illustrating a configuration example of a pixel of the photoelectric conversion device according to the first embodiment of the present invention.
Figure 4:
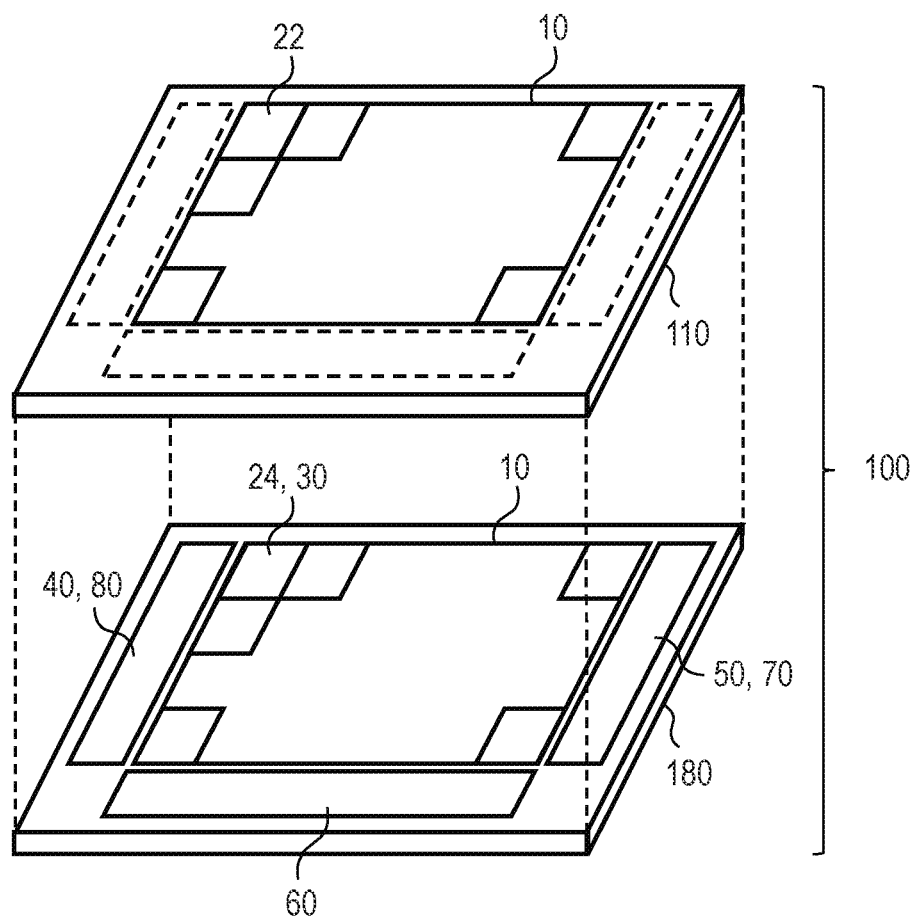
FIG. 4 is a perspective view illustrating a configuration example of the photoelectric conversion device according to the first embodiment of the present invention.

A schematic configuration of a photoelectric conversion device according to a first embodiment of the present invention will be described with reference to FIG. 1 to FIG. 4. FIG. 1 and FIG. 2 are block diagrams illustrating a schematic configuration of a photoelectric conversion device according to the present embodiment. FIG. 3 is a block diagram illustrating a configuration example of a pixel of the photoelectric conversion device according to the present embodiment. FIG. 4 is a perspective view illustrating a configuration example of the photoelectric conversion device according to the present embodiment.

As illustrated in FIG. 1, the photoelectric conversion device 100 according to the present embodiment includes a pixel region 10, a vertical scanning circuit unit 40, a readout circuit unit 50, a horizontal scanning circuit unit 60, an output circuit unit 70, and a control pulse generation unit 80.

The pixel region 10 is provided with a plurality of pixels 12 arranged in an array so as to form a plurality of rows and a plurality of columns. Each pixel 12 may include a photoelectric conversion unit including a photoelectric conversion element and a pixel signal processing unit that processes a signal output from the photoelectric conversion unit, as will be described later. The number of pixels 12 constituting the pixel region 10 is not particularly limited. For example, the pixel region 10 may be constituted by a plurality of pixels 12 arranged in an array of several thousands of rows and several thousands of columns as in a general digital camera. Alternatively, the pixel region 10 may be constituted by a plurality of pixels 12 arranged in one row or one column. Alternatively, one pixel 12 may constitute the pixel region 10.

In each row of the pixel array of the pixel region 10, a control line 14 is arranged so as to extend in a first direction (lateral direction in FIG. 1). The control line 14 is connected to the pixels 12 arranged in the first direction, and serves as a signal line common to these pixels 12. The first direction in which the control line 14 extends may be denoted as a row direction or a horizontal direction. Each of the control lines 14 may include a plurality of signal lines for supplying a plurality of types of control signals to the pixels 12.

In addition, in each column of the pixel array of the pixel region 10, a data line 16 is arranged so as to extend in a second direction (vertical direction in FIG. 1) intersecting with the first direction. The data line 16 is connected to the pixels 12 arranged in the second direction, and serves as a signal line common to these pixels 12. The second direction in which the data line 16 extends may be referred to as a column direction or a vertical direction. Each of the data lines 16 may include a plurality of signal lines for transferring a digital signal of a plurality of bits output from the pixel 12 for each bit.

The control line 14 in each row is connected to the vertical scanning circuit unit 40. The vertical scanning circuit unit 40 is a control unit having a function of receiving control signals output from the control pulse generation unit 80, generating control signals for driving the pixels 12, and supplying the generated control signals to the pixels 12 via the control lines 14. A logic circuit such as a shift register or an address decoder may be used for the vertical scanning circuit unit 40. The vertical scanning circuit unit 40 sequentially scans the pixels 12 in the pixel region 10 in units of rows, and sequentially outputs pixel signals of the pixels 12 to the readout circuit unit 50 via the data lines 16.

The data line 16 in each column is connected to the readout circuit unit 50. The readout circuit unit 50 includes a plurality of holding units (not illustrated) provided in correspondence with each column of the pixel array of the pixel region 10, and has a function of holding the pixel signals of the pixels 12 of each column output from the pixel region 10 in units of rows via the data line 16 in the holding units of the corresponding columns.

The horizontal scanning circuit unit 60 is a control unit that receives a control signal output from the control pulse generation unit 80, generates a control signal for reading out a pixel signal from a holding unit of each column of the readout circuit unit 50, and supplies the control signal to the readout circuit unit 50. A logic circuit such as a shift register or an address decoder may be used for the horizontal scanning circuit unit 60. The horizontal scanning circuit unit 60 sequentially scans the holding units of the respective columns of the readout circuit unit 50, and sequentially outputs the pixel signals held in the respective columns to the output circuit unit 70.

The output circuit unit 70 includes an external interface circuit, and outputs the pixel signals output from the readout circuit unit 50 to the outside of the photoelectric conversion device 100. The external interface circuit included in the output circuit unit 70 is not particularly limited. For example, SerDes (SERializer/DESerializer) transmission circuits such as LVDS (Low Voltage Differential Signaling) circuit and SLVS (Scalable Low Voltage Signaling) circuit may be applied to the external interface circuit.

The control pulse generation unit 80 is a control circuit for generating control signals for controlling the operation and timing of the operation of the vertical scanning circuit unit 40, the readout circuit unit 50, and the horizontal scanning circuit unit 60, and supplying the generated control signals to each functional block. At least a part of the control signals for controlling the operation and timing of the operation of the vertical scanning circuit unit 40, the readout circuit unit 50, and the horizontal scanning circuit unit 60 may be supplied from the outside of the photoelectric conversion device 100.

The connection mode of each functional block of the photoelectric conversion device 100 is not limited to the configuration example illustrated in FIG. 1, and may be configured as illustrated in FIG. 2, for example.

In the configuration example of FIG. 2, a data line 16 extending in the first direction is arranged in each row of the pixel array of the pixel region 10. The data line 16 is connected to the pixels 12 arranged in the first direction, and serves as a signal line common to these pixels 12. In addition, a control line 18 extending in the second direction is arranged in each column of the pixel array of the pixel region 10. The control line 18 is connected to the pixels 12 arranged in the second direction, and serves as a signal line common to these pixels 12.

The control line 18 in each column is connected to the horizontal scanning circuit unit 60. The horizontal scanning circuit unit 60 receives control signals output from the control pulse generation unit 80, generates control signals for reading out pixel signals from the pixels 12, and supplies the generated control signals to the pixels 12 via the control lines 18. Specifically, the horizontal scanning circuit unit 60 sequentially scans the plurality of pixels 12 in the pixel region 10 in units of columns, and outputs the pixel signal of the pixel 12 in each row belonging to the selected column to the data lines 16.

The data line 16 of each row is connected to the readout circuit unit 50. The readout circuit unit 50 includes a plurality of holding units (not illustrated) provided in correspondence with each row of the pixel array of the pixel region 10, and has a function of holding the pixel signals of the pixels 12 of each row outputted from the pixel region 10 in units of columns via the data lines 16 in the holding units of the corresponding rows.

The readout circuit unit 50 receives the control signals output from the control pulse generation unit 80, and sequentially outputs the pixel signals held in the holding units of the respective rows to the output circuit unit 70.

Other configurations in the configuration example of FIG. 2 may be similar to those in the configuration example of FIG. 1.

As illustrated in FIG. 3, each pixel 12 includes a photoelectric conversion unit 20 and a pixel signal processing unit 30. The photoelectric conversion unit 20 may include a photoelectric conversion element 22 and a quenching element 24. The pixel signal processing unit 30 may include a signal processing circuit 32, a counter 34, and a pixel output circuit 36.

The photoelectric conversion element 22 may be an avalanche photodiode (hereinafter referred to as "APD"). An anode of the APD constituting the photoelectric conversion element 22 is connected to a node to which the voltage VL is supplied. A cathode of the APD constituting the photoelectric conversion element 22 is connected to one terminal of the quenching element 24. A connection node between the photoelectric conversion element 22 and the quenching element 24 is an output node of the photoelectric conversion unit 20. The other terminal of the quenching element 24 is connected to a node to which a voltage VH higher than the voltage VL is supplied. The voltage VL and the voltage VH are set such that a reverse bias voltage sufficient for the APD to perform the avalanche multiplication operation is applied. In one example, a negative high voltage is applied as the voltage VL, and a positive voltage as high as a power supply voltage is applied as the voltage VH. For example, the voltage VL is −30 V and the voltage VH is 1 V.

The photoelectric conversion element 22 may be formed of an APD as described above. By supplying a reverse bias voltage sufficient to perform the avalanche multiplication operation to the APD, charge generated by light incidence to the APD cause avalanche multiplication, and an avalanche current is generated. The operation modes in a state where a reverse bias voltage is supplied to the APD include a Geiger mode and a linear mode. The Geiger mode is an operation mode in which a voltage applied between an anode and a cathode is set to a reverse bias voltage larger than a breakdown voltage of the APD. The linear mode is an operation mode in which a voltage applied between an anode and a cathode is set to a reverse bias voltage close to or lower than a breakdown voltage of the APD. The APD operating in the Geiger mode is called SPAD (Single Photon Avalanche Diode). The APD constituting the photoelectric conversion element 22 may operate in the linear mode or the Geiger mode.

In the present embodiment, the anode of the APD is set to a fixed potential, and a signal is extracted from the cathode side. Therefore, the semiconductor region of the first conductivity type in which charge having the same polarity as the signal charge is a majority carrier is an n-type semiconductor region, and the semiconductor region of the second conductivity type in which charge having a polarity different from the signal charge is a majority carrier is a p-type semiconductor region. The carriers of the first conductivity type are electrons, and the carriers of the second conductivity type are holes. Note that the present invention is true even when the cathode of the APD is set to a fixed potential and a signal is extracted from the anode side. In this case, the semiconductor region of the first conductivity type in which charge having the same polarity as the signal charge is a majority carrier is a p-type semiconductor region, and the semiconductor region of the second conductivity type in which charge having a polarity different from the signal charge is a majority carrier is an n-type semiconductor region. Although the case where one node of the APD is set to a fixed potential is described below, potentials of both nodes may be varied.

In this specification, when the term "impurity concentration" is used, it means a net impurity concentration obtained by subtracting the amount compensated by the impurities of the opposite conductivity type. That is, the "impurity concentration" refers to the net doping concentration. A region where the doped concentration of the p-type impurity is higher than the doped concentration of the n-type impurity is a p-type semiconductor region. Conversely, a region where the doped concentration of the n-type impurity is higher than the doped concentration of the p-type impurity is an n-type semiconductor region.

The quenching element 24 has a function of converting a change in the avalanche current generated in the photoelectric conversion element 22 into a voltage signal. Further, the quenching element 24 functions as a load circuit (quenching circuit) at the time of signal multiplication by avalanche multiplication, and has a function of reducing a voltage applied to the photoelectric conversion element 22 to suppress avalanche multiplication. The operation in which the quenching element 24 suppresses avalanche multiplication is called a quenching operation. Further, the quenching element 24 has a function of returning the voltage supplied to the photoelectric conversion element 22 to the voltage VH by flowing a current corresponding to the voltage drop by the quenching operation. The operation in which the quenching element 24 returns the voltage supplied to the photoelectric conversion element 22 to the voltage VH is called a recharging operation. The quenching element 24 may be composed of a resistor, a MOS transistor, or the like.

The signal processing circuit 32 includes an input node to which an output signal of the photoelectric conversion unit 20 is supplied, and an output node. The signal processing circuit 32 has a function as a waveform shaping unit that converts an analog signal supplied from the photoelectric conversion unit 20 into a pulse signal. The signal processing circuit 32 may be configured by a logic circuit including a NOT circuit (inverter circuit), a NOR circuit, a NAND circuit, and the like. The output node of the signal processing circuit 32 is connected to the counter 34.

The counter 34 includes an input node to which an output signal of the signal processing circuit 32 is supplied, an input node connected to the control line 14, and an output node. The counter 34 has a function of counting pulses to be superimposed on a signal output from the signal processing circuit 32, and holding a count value as a counting result. The signal supplied from the vertical scanning circuit unit 40 to the counter 34 via the control line 14 may include an enable signal for controlling a pulse counting period (exposure period), a reset signal for resetting a count value held by the counter 34, and the like. The output node of the counter 34 is connected to the data line 16 via the pixel output circuit 36.

The pixel output circuit 36 has a function of switching an electrical connection state (connection or disconnection) between the counter 34 and the data line 16. The pixel output circuit 36 switches the connection state between the counter 34 and the data line 16 in accordance with a control signal supplied from the vertical scanning circuit unit 40 via the control line 14 (a control signal supplied from the horizontal scanning circuit unit 60 via the control line 18 in the configuration example of FIG. 2). The pixel output circuit 36 may include a buffer circuit for outputting a signal.

The pixel 12 is typically a unit structure that outputs a pixel signal for forming an image. However, in the case where distance measurement using a time of flight (TOF) method or the like is intended, the pixel 12 need not necessarily be a unit structure that outputs a pixel signal for forming an image. That is, the pixel 12 may be a unit structure that outputs a signal for measuring the time at which light has reached and the amount of light.

One pixel signal processing unit 30 is not necessarily provided for each pixel 12, and one pixel signal processing unit 30 may be provided for a plurality of pixels 12. In this case, one pixel signal processing unit 30 may be used to sequentially perform signal processing of a plurality of pixels 12.

The photoelectric conversion device 100 according to the present embodiment may be formed on one substrate, or may be configured as a stacked-type photoelectric conversion device in which a plurality of substrates is stacked. In the latter case, for example, as illustrated in FIG. 4, a sensor substrate 110 and a circuit substrate 180 may be stacked and electrically connected to each other to form a stacked-type photoelectric conversion device. At least the photoelectric conversion element 22 among the components of the pixel 12 may be disposed on the sensor substrate 110. Further, the quenching element 24 and the pixel signal processing unit 30 among the components of the pixel 12 may be disposed on the circuit substrate 180. The photoelectric conversion element 22, the quenching element 24, and the pixel signal processing unit 30 are electrically connected to each other via a connection interconnection provided for each pixel 12. The circuit substrate 180 may further include the vertical scanning circuit unit 40, the readout circuit unit 50, the horizontal scanning circuit unit 60, the output circuit unit 70, the control pulse generation unit 80, and the like.

The photoelectric conversion element 22 of each pixel 12, and the quenching element 24 and the pixel signal processing unit 30 may be provided on the sensor substrate 110 and the circuit substrate 180 so as to overlap each other in a plan view. The vertical scanning circuit unit 40, the readout circuit unit 50, the horizontal scanning circuit unit 60, the output circuit unit 70, and the control pulse generation unit 80 may be arranged around the pixel region 10 formed by the plurality of pixels 12. Here, the "plan view" refers to a view from a direction perpendicular to the surface of the sensor substrate 110.

By configuring the stacked-type photoelectric conversion device 100, the degree of integration of elements may be increased and high functionality may be achieved. In particular, by disposing the photoelectric conversion element 22, and the quenching element 24 and the pixel signal processing unit 30 on different substrates, the photoelectric conversion element 22 may be disposed at high density without sacrificing the light receiving area of the photoelectric conversion element 22, and the photon detection efficiency may be improved.

The number of substrates constituting the photoelectric conversion device 100 is not limited to two, and three or more substrates may be stacked to form the photoelectric conversion device 100.

Although the sensor substrate 110 and the circuit substrate 180 are diced chips in FIG. 4, the sensor substrate 110 and the circuit substrate 180 are not limited to chips. For example, each of the sensor substrate 110 and the circuit substrate 180 may be a wafer. Further, the sensor substrate 110 and the circuit substrate 180 may be stacked in a wafer state and then diced, or may be stacked and bonded after each sensor substrate 110 and the circuit substrate 180 are formed into chips.

Figure 5A:
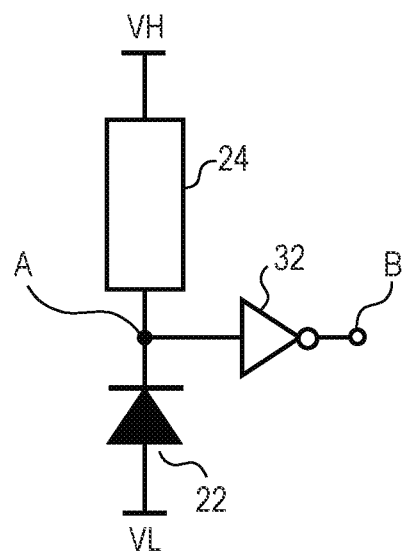
FIG. 5A, FIG. 5B, and FIG. 5C are diagrams illustrating the basic operation of the photoelectric conversion unit in the photoelectric conversion device according to the first embodiment of the present invention.
Figure 5B:
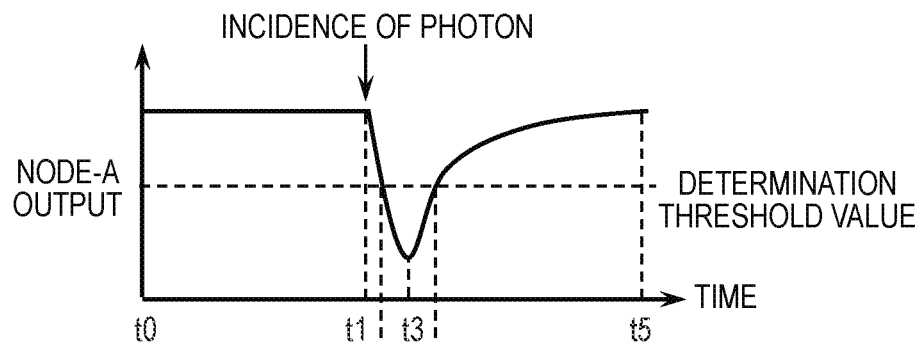
Figure 5C:
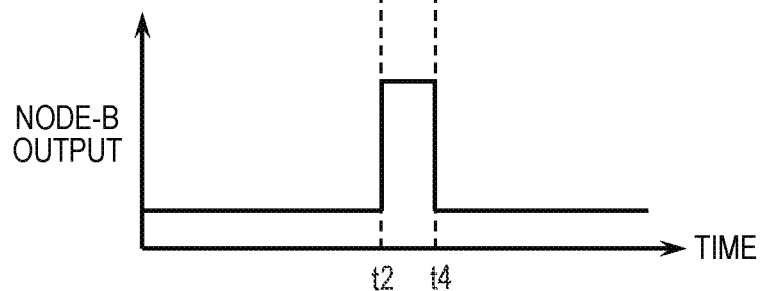

Next, a basic operation of the photoelectric conversion unit 20 in the photoelectric conversion device according to the present embodiment will be described with reference to FIG. 5A to FIG. 5C. FIG. 5A to FIG. 5C are diagrams illustrating the basic operation of the photoelectric conversion unit in the photoelectric conversion device according to the present embodiment. FIG. 5A is a circuit diagram of the photoelectric conversion unit 20 and the signal processing circuit 32, FIG. 5B illustrates a waveform of a signal at an input node (node A) of the signal processing circuit 32, and FIG. 5C illustrates a waveform of a signal at an output node (node B) of the signal processing circuit 32. Here, for simplicity of explanation, it is assumed that the signal processing circuit 32 is configured by an inverter circuit.

At time t0, a reverse bias voltage of a potential difference corresponding to (VH-VL) is applied to the photoelectric conversion element 22. Although a reverse bias voltage sufficient to cause avalanche multiplication is applied between the anode and the cathode of the APD constituting the photoelectric conversion element 22, there is no carrier that becomes a cause of avalanche multiplication in a state where no photon is incident on the photoelectric conversion element 22. Therefore, no avalanche multiplication occurs in the photoelectric conversion element 22, and no current flows through the photoelectric conversion element 22.

At time t1, it is assumed that a photon enters the photoelectric conversion element 22. When the photon is incident on the photoelectric conversion element 22, an electron-hole pair is generated by photoelectric conversion, avalanche multiplication occurs using these carriers as a cause, and an avalanche multiplication current flows through the photoelectric conversion element 22. When the avalanche multiplication current flows through the quenching element 24, a voltage drop by the quenching element 24 occurs, and the voltage of the node A begins to drop. When the voltage drop amount of the node A increases and the avalanche multiplication stops at time t3, the voltage level of the node A does not drop any further.

When the avalanche multiplication in the photoelectric conversion element 22 stops, a current that compensates the voltage drop flows from the node to which the voltage VL is supplied to the node A via the photoelectric conversion element 22, and the voltage of the node A gradually increases. Then, at time t5, node A is settled to the original voltage level.

The signal processing circuit 32 binarizes the signal input from the node A according to a predetermined determination threshold value, and outputs the signal from the node B. Specifically, the signal processing circuit 32 outputs a Low-level signal from the node B when the voltage level of the node A exceeds the determination threshold value, and outputs a High-level signal from the node B when the voltage level of the node A is equal to or lower than the determination threshold value. For example, as illustrated in FIG. 5B, it is assumed that the voltage of the node A is equal to or lower than the determination threshold value during a period from the time t2 to the time t4. In this case, as illustrated in FIG. 5C, the signal level at the node B is Low-level during the period from the time t0 to the time t2, and during the period from the time t4 to the time t5, and is High-level during the period from the time t2 to the time t4.

Thus, the analog signal input from the node A is shaped into a digital signal by the signal processing circuit 32. A pulse signal output from the signal processing circuit 32 in response to incidence of a photon on the photoelectric conversion element 22 is a photon detection pulse signal.

Figure 6:
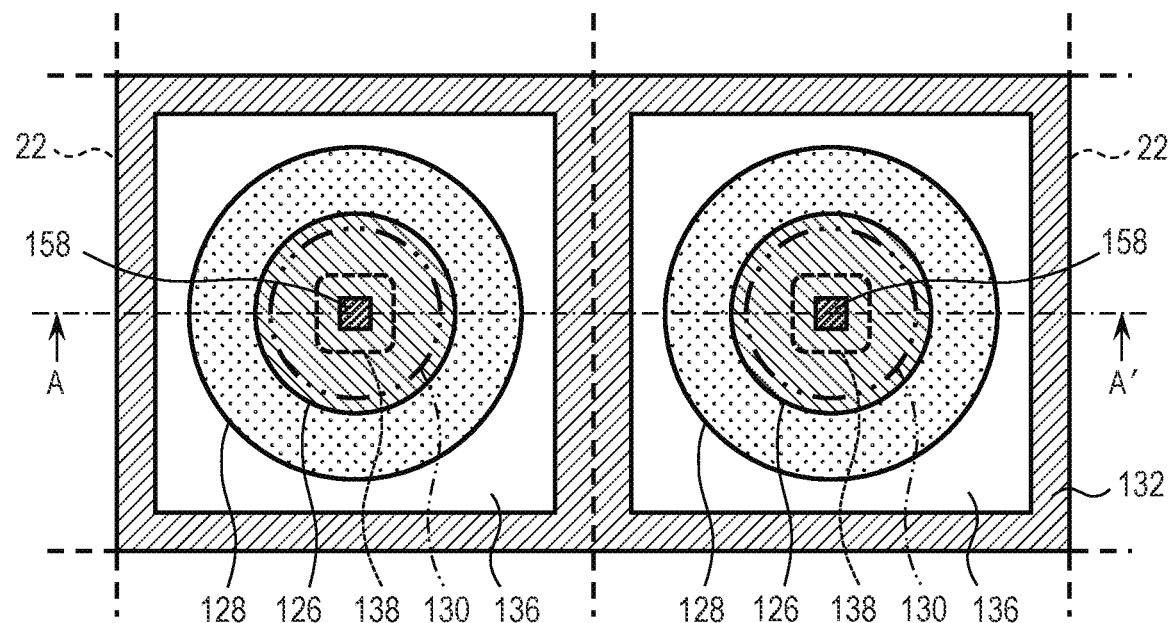
FIG. 6 is a plan view illustrating a structure of a photoelectric conversion element in the photoelectric conversion device according to the first embodiment of the present invention.
Figure 7:
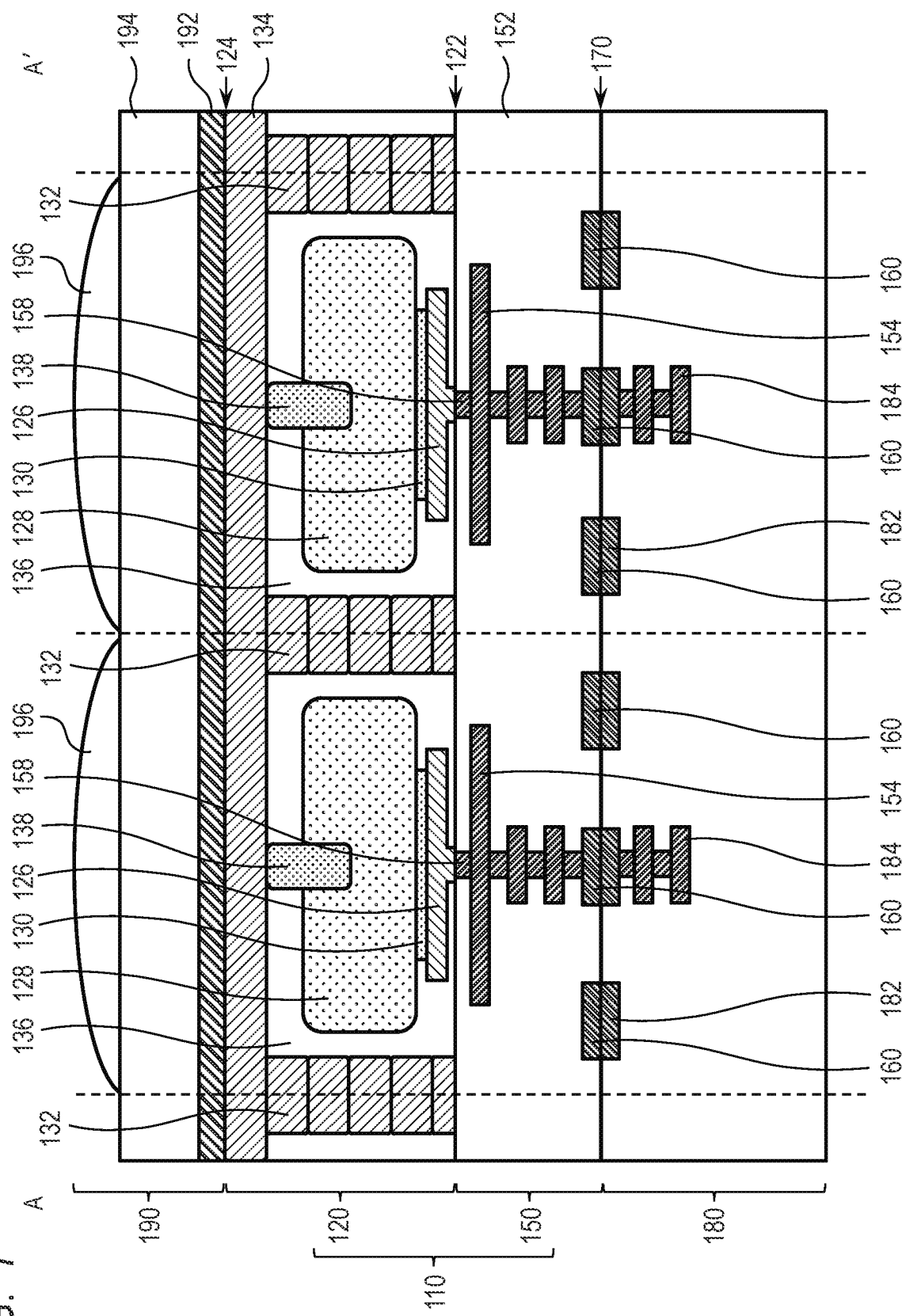
FIG. 7 is a schematic cross-sectional view illustrating a structure of the photoelectric conversion element in the photoelectric conversion device according to the first embodiment of the present invention.

Next, a specific structure of the photoelectric conversion element 22 in the photoelectric conversion device 100 according to the present embodiment will be described with reference to FIG. 6 and FIG. 7. FIG. 6 is a plan view illustrating a structure of the photoelectric conversion element in the photoelectric conversion device according to the present embodiment. FIG. 7 is a schematic cross-sectional view illustrating a structure of the photoelectric conversion element in the photoelectric conversion device according to the present embodiment.

FIG. 6 is a plan view of photoelectric conversion elements 22 of two pixels 12 arranged adjacent to each other among a plurality of pixels 12 constituting the pixel region 10. FIG. 7 is a cross-sectional view taken along line A-A' of FIG. 6.

In this specification, the term "plan view" refers to a normal direction of a light incident surface (second surface 124) of the semiconductor layer 120 or a surface (first surface 122) opposite to the light incident surface described later. FIG. 6 corresponds to a plan view of the semiconductor layer 120 from a side of a first surface 122. In addition, a cross section refers to a plane parallel to a normal direction of the first surface 122 or the second surface 124 of the semiconductor layer 120. When the first surface 122 or the second surface 124 of the semiconductor layer 120 is a rough surface when viewed microscopically, the plan view is defined with reference to the first surface 122 or the second surface 124 of the semiconductor layer 120 when viewed macroscopically. In this specification, the depth direction is a direction from the first surface 122 to the second surface 124 of the semiconductor layer 120. Hereinafter, the first surface 122 may be referred to as a "front surface" and the second surface 124 may be referred to as a "back surface".

For example, as illustrated in FIG. 7, the photoelectric conversion device according to the present embodiment may be configured as a stacked-type photoelectric conversion device in which the sensor substrate 110 and the circuit substrate 180 are stacked.

The sensor substrate 110 includes a semiconductor layer 120 having a first surface 122 and a second surface 124 opposed to the first surface 122, and an interconnection structure layer 150 provided on a side of the first surface 122 of the semiconductor layer 120. An optical structure layer 190 may be disposed over a side of the second surface 124 of the semiconductor layer 120. The side of the second surface 124 of the semiconductor layer 120 provided with the optical structure layer 190 serves as a light receiving surface for receiving light to be detected. That is, the photoelectric conversion device according to the present embodiment is a so-called backside illumination type photoelectric conversion device.

The semiconductor layer 120 is formed by thinning a single crystalline silicon substrate, for example, and contains an n-type impurity or a p-type impurity at a predetermined concentration. Here, as an example, it is assumed that the semiconductor layer 120 is formed by thinning a p-type silicon substrate.

The semiconductor layer 120 includes n-type semiconductor regions 126 and 128 and p-type semiconductor regions 130, 132, 134 and 138. The n-type semiconductor region 126 is disposed on the side of the first surface 122 of the semiconductor layer 120 in a cross-sectional view, and at least a part of the n-type semiconductor region 126 reaches the first surface 122 of the semiconductor layer 120. The p-type semiconductor region 130 is disposed closer to the second surface 124 of the semiconductor layer 120 than the n-type semiconductor region 126, and forms a p-n junction with the n-type semiconductor region 126. The p-type semiconductor region 134 is disposed on the side of the second surface 124 of the semiconductor layer 120 in the cross-sectional view. The n-type semiconductor region 128 is disposed in a region between the p-type semiconductor region 130 and the p-type semiconductor region 134 so as to be separated from the p-type semiconductor region 134. The p-type semiconductor region 138 is disposed in a region between the n-type semiconductor region 128 and the p-type semiconductor region 134. That is, in the semiconductor layer 120, the n-type semiconductor region 126, the p-type semiconductor region 130, the n-type semiconductor region 128, the p-type semiconductor region 138, and the p-type semiconductor region 134 are arranged in this order along the depth direction from the first surface 122 to the second surface 124.

In a plan view, the p-type semiconductor region 134 overlaps the entire region where the n-type semiconductor regions 126 and 128 and the p-type semiconductor regions 130 and 138 are arranged. The p-type semiconductor region 132 is disposed so as to surround each of the regions in which the n-type semiconductor regions 126 and 128 and the p-type semiconductor regions 130 and 138 are provided in the plan view. The p-type semiconductor region 132 is disposed from the first surface 122 of the semiconductor layer 120 to a depth at which the p-type semiconductor region 134 is disposed, and is electrically connected to the p-type semiconductor region 134. A region in the semiconductor layer 120 surrounded by the p-type semiconductor regions 132 and 134 is a well region (semiconductor region 136) in which the n-type semiconductor regions 126 and 128 and the p-type semiconductor regions 130 and 138 of one photoelectric conversion element 22 are arranged. Note that in the present embodiment, the conductivity type of the semiconductor region 136 is a p-type.

In the plan view, the n-type semiconductor region 128 is disposed inside the region defined by the p-type semiconductor region 132. In the plan view, the n-type semiconductor region 126 is disposed in a region inside the n-type semiconductor region 128. In the plan view, the p-type semiconductor region 130 is disposed in a region inside the n-type semiconductor region 126. In the plan view, the p-type semiconductor region 138 is disposed in a region inside the n-type semiconductor region 128. That is, the area of the p-type semiconductor region 138 in the plan view is smaller than the area of the n-type semiconductor region 128 in the plan view. The p-type semiconductor region 138 is positioned at a center portion of the photoelectric conversion element 22 in the plan view. Here, the center portion of the photoelectric conversion element 22 in the plan view may be a portion where an extraction portion of the signal charge from the photoelectric conversion element 22 (a portion where the n-type semiconductor region 126 and a cathode electrode 158 overlap each other in the plan view) is located in a plan view.

The semiconductor region 136 is disposed so as to surround the n-type semiconductor region 128 at a depth at which the n-type semiconductor region 128 is provided. The semiconductor region 136 is disposed between the n-type semiconductor region 128 and the p-type semiconductor region 132 at a depth at which the n-type semiconductor region 128 is provided. The semiconductor region 136 is disposed between the n-type semiconductor region 126 and the p-type semiconductor region 130, and the p-type semiconductor region 132 at a depth where the n-type semiconductor region 126 and the p-type semiconductor region 130 are provided. The semiconductor region 136 extends in a region between the n-type semiconductor region 128 and the p-type semiconductor region 134 except a region where the p-type semiconductor region 138 is disposed.

The p-type semiconductor region 138 forms a p-n junction with the n-type semiconductor region 128. The impurity concentration of the p-type semiconductor region 138 is desirably lower than the impurity concentration of the p-type semiconductor region 134. In the cross-sectional view, an end of the p-type semiconductor region 138 on the side of the first surface 122 is positioned closer to the first surface 122 than an end of the n-type semiconductor region 128 on the side of the second surface 124.

In the present embodiment, one photoelectric conversion element 22 includes the n-type semiconductor regions 126 and 128 and the p-type semiconductor regions 130, 132, 134 and 138. The photoelectric conversion elements 22 arranged next to each other are electrically isolated from each other by the p-type semiconductor regions 132 and 134. That is, the p-type semiconductor regions 132 and 134 form an isolation portion that electrically isolates the photoelectric conversion elements 22 from each other. A depletion layer formed in the p-n junction between the n-type semiconductor region 126 and the p-type semiconductor region 130 becomes an avalanche multiplication region. The n-type semiconductor region 128 serves to quickly collect charges generated in the semiconductor layer 120 in the avalanche multiplication region. The impurity concentration of the n-type semiconductor region 128 is lower than the impurity concentration of the n-type semiconductor region 126.

In FIG. 7, although the n-type semiconductor region 128 is provided in contact with the p-type semiconductor region 130, the n-type semiconductor region 128 may be provided apart from the p-type semiconductor region 130. Although the p-type semiconductor region 134 is provided in contact with the second surface 124, the p-type semiconductor region 134 may be provided apart from the second surface 124. In the configuration example illustrated in FIG. 6 and FIG. 7, although the n-type semiconductor region 128 is provided apart from the p-type semiconductor region 132, the n-type semiconductor region 128 may be provided in contact with the p-type semiconductor region 132.

The interconnection structure layer 150 includes an insulating layer 152 and an interconnection layer 154 disposed in the insulating layer 152. The interconnection layer 154 includes an anode electrode (not illustrated) electrically connected to the p-type semiconductor region 132, a cathode electrode 158 electrically connected to the n-type semiconductor region 126, and a pad electrode 160 formed of an interconnection layer most distant from the semiconductor layer 120. As illustrated in FIG. 6, the cathode electrode 158 is disposed at the center portion of the n-type semiconductor region 126 in the plan view. A plurality of cathode electrodes 158 may be disposed for one n-type semiconductor region 126.

The circuit substrate 180 is stacked on the side of the interconnection structure layer 150 of the sensor substrate 110. A bonding surface 170 in FIG. 7 is a bonding portion between the sensor substrate 110 and the circuit substrate 180. The circuit substrate 180 includes a semiconductor layer provided with elements such as transistors and an interconnection structure layer provided over the semiconductor layer. FIG. 7 illustrates only pad electrodes 182 formed of the uppermost interconnection layer and a part of the interconnection layer 184 connected to the pad electrode 182 among the semiconductor layer and the interconnection structure layer constituting the circuit substrate 180 for simplification of the drawing. The sensor substrate 110 and the circuit substrate 180 may be bonded to each other by, for example, metal bonding between a metal member constituting the pad electrodes 160 and a metal member constituting the pad electrodes 182.

For example, as illustrated in FIG. 7, the optical structure layer 190 may include a pinning film 192, a planarization layer 194, and a microlens layer including a plurality of microlenses 196. The optical structure layer 190 may further include a filter layer (not illustrated). Various optical filters such as a color filter, an infrared light cut filter, and a monochrome filter may be applied to the filter layer. Instead of providing the p-type semiconductor region 134 in the semiconductor layer 120, the pinning film 192 may be provided so as to be in contact with the p-type semiconductor region 132. A known material may be applied to the pinning film 192. The photoelectric conversion element 22 does not necessarily have to include the optical structure layer 190. The optical structure layer 190 may include only a part of the above-described elements, or may further include other elements.

The photoelectric conversion element 22 generates an avalanche multiplication by a reverse bias voltage applied between the n-type semiconductor region 128 and the p-type semiconductor region 130 via the anode electrode (not illustrated) and the cathode electrode 158 using charges generated in the semiconductor layer 120 by photoelectric conversion as causes. The carriers generated by the avalanche multiplication are output to the outside of the photoelectric conversion element 22 via the cathode electrode 158. Therefore, the response speed of the photoelectric conversion element 22 is improved as the charges generated in the semiconductor layer 120 may be collected in the avalanche multiplication region more quickly.

In this respect, in the photoelectric conversion element 22 according to the present embodiment, as described above, the n-type semiconductor region 128 whose impurity concentration is lower than that of the n-type semiconductor region 126 is disposed between the p-type semiconductor region 130 and the p-type semiconductor region 134. Therefore, the potential of the n-type semiconductor region 128 becomes lower than the potential of the semiconductor region 136 for the signal charge, and it becomes possible to collect more signal charges in the avalanche multiplication region in a shorter time.

In the photoelectric conversion element 22 according to the present embodiment, the p-type semiconductor region 138 is further provided between the n-type semiconductor region 128 and the p-type semiconductor region 134. The effect of providing the p-type semiconductor region 138 will be described below with reference to FIG. 8A to FIG. 12B.

FIG. 8A, FIG. 8B, FIG. 10A, and FIG. 10B are diagrams illustrating a potential distribution and a charge transfer path inside the photoelectric conversion element 22. FIG. 9A, FIG. 9B, FIG. 11A and FIG. 11B illustrate frequency distributions (probability distributions) of time required for charges generated in the photoelectric conversion element 22 to reach the avalanche multiplication region. FIG. 8A, FIG. 8B, FIG. 9A and FIG. 9B illustrate the case of a photoelectric conversion element in which the p-type semiconductor region 138 is not provided (reference example), and FIG. 10A, FIG. 10B, FIG. 11A and FIG. 11B illustrate the case of the photoelectric conversion element according to the present embodiment that includes the p-type semiconductor region 138.

Figure 8A:
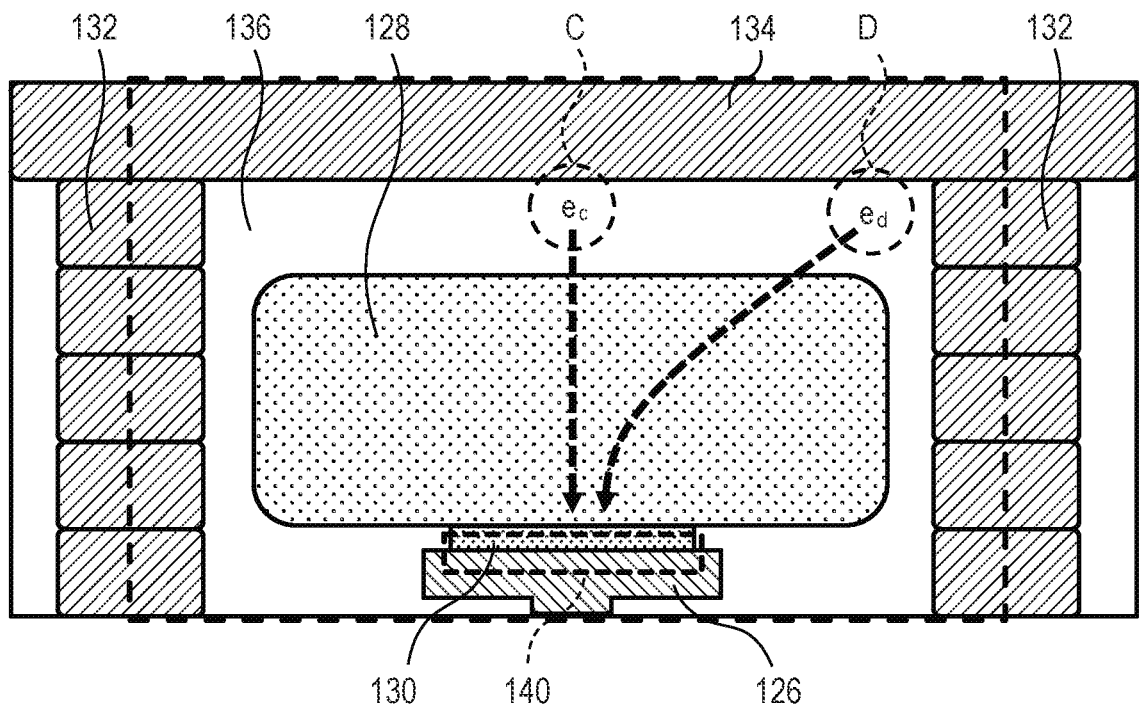
FIG. 8A and FIG. 8B are diagrams illustrating a potential distribution and a charge transfer path inside the photoelectric conversion element according to a reference example.
Figure 8B:
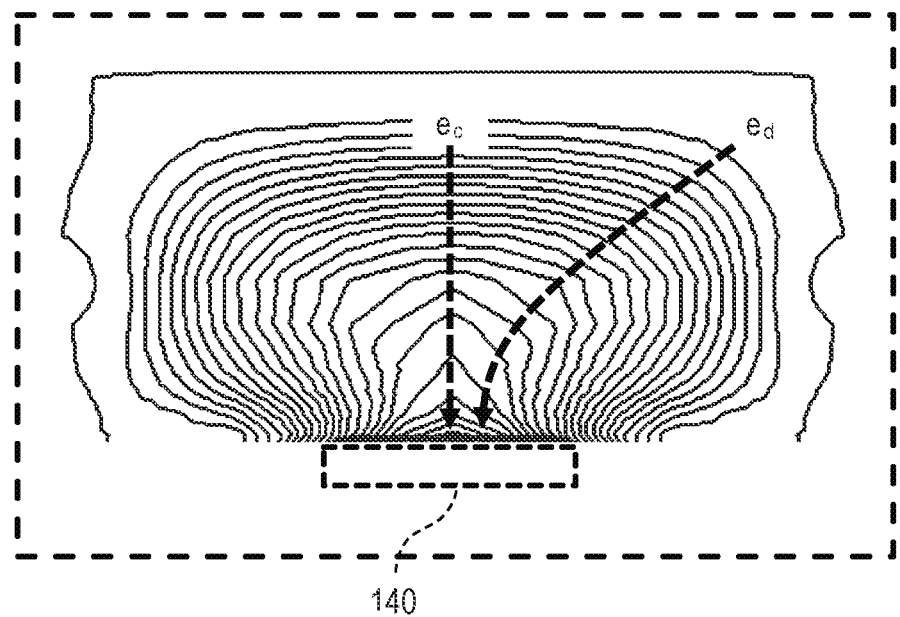

FIG. 8A is a schematic cross-sectional view illustrating a photoelectric conversion element of a reference example. The photoelectric conversion element of the reference example has a structure similar to that of the photoelectric conversion element 22 according to the present embodiment except that the p-type semiconductor region 138 is not provided. FIG. 8B is a diagram illustrating a result obtained by simulation of a potential distribution in a region enclosed by a broken line in FIG. 8A.

In the photoelectric conversion element of the reference example, it is assumed that charge $e_c$ and charge $e_d$ are generated by incidence of light in the semiconductor region 136 on the side of the p-type semiconductor region 134 with respect to the n-type semiconductor region 128. Here, the charge $e_c$ is a charge generated in the center portion (region C) of the photoelectric conversion element in a plan view, and the charge $e_d$ is a charge generated in the peripheral portion (region D) of the photoelectric conversion element in the plan view.

When the photoelectric conversion element is driven, a predetermined reverse bias voltage is applied between the p-type semiconductor regions 132 and 134 and the n-type semiconductor region 126. Thereby, a potential distribution as illustrated in FIG. 8B is formed in the n-type semiconductor region 128 and the semiconductor region 136. The potential gradient formed in the n-type semiconductor region 128 and the semiconductor region 136 in this manner is lower in the direction from the peripheral portion of the semiconductor region 136 toward the avalanche multiplication region 140 with respect to the signal charges. Therefore, each of the charge $e_c$ generated in the region C and the charge $e_d$ generated in the region D is drawn toward the avalanche multiplication region 140 along, for example, a path indicated by a broken arrow in FIG. 8A and FIG. 8B.

Figure 9A:
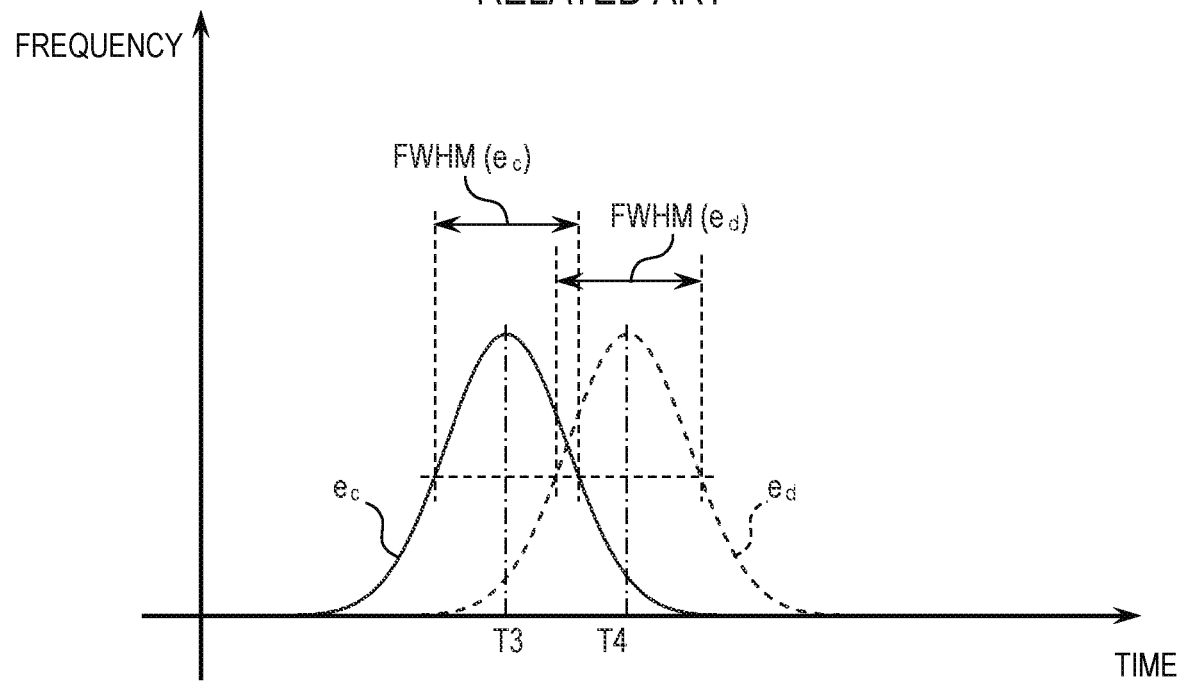
FIG. 9A, FIG. 9B and FIG. 12A illustrate frequency distributions of time required to reach an avalanche multiplication region for charges generated inside the photoelectric conversion element according to the reference example.
Figure 9B:
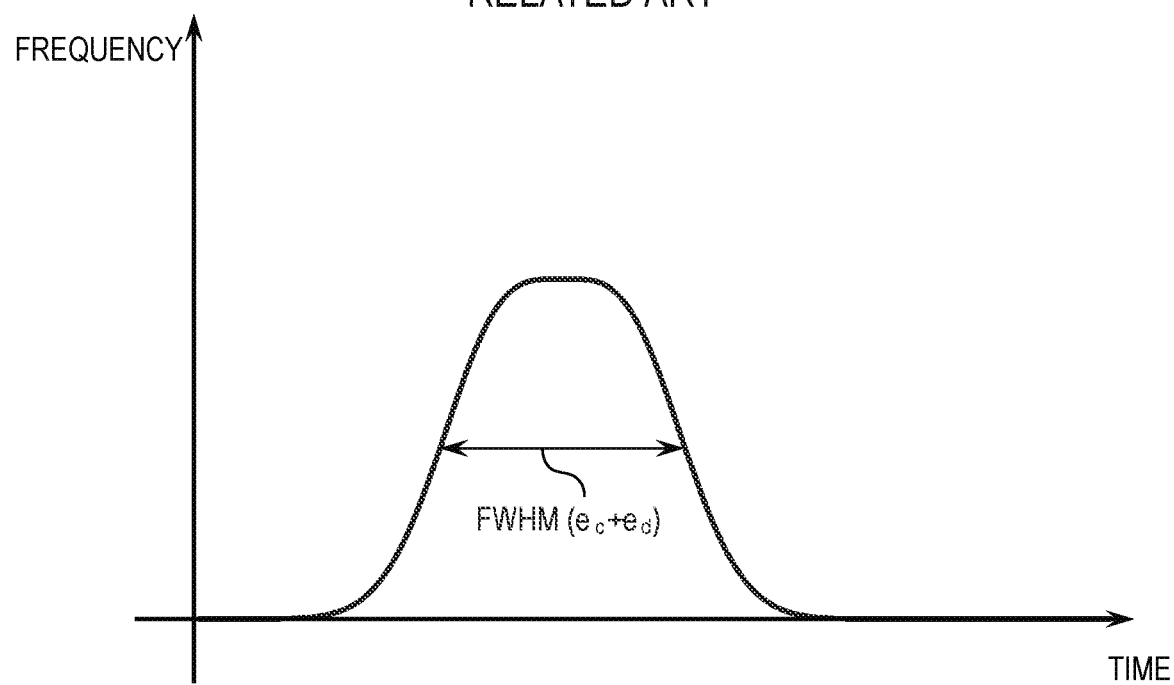

FIG. 9A and FIG. 9B illustrate the frequency distribution (probability distribution) of the time required for the charge $e_c$ generated in the region C and the charge $e_d$ generated in the region D to reach the avalanche multiplication region 140. FIG. 9A separately illustrates a frequency distribution of time required for the charge $e_c$ generated in the region C to reach the avalanche multiplication region 140 and a frequency distribution of time required for the charge $e_d$ generated in the region D to reach the avalanche multiplication region 140. FIG. 9B illustrates one frequency distribution of the time required for the charge $e_c$ generated in the region C and the charge $e_d$ generated in the region D to reach the avalanche multiplication region 140. In FIG. 9A, T3 is an average value of the time required for the charge $e_c$ to reach the avalanche multiplication region 140, and T4 is an average value of the time required for the charge $e_d$ to reach the avalanche multiplication region 140. The spread in the horizontal axis direction in the graphs of FIG. 9A and FIG. 9B represents a variation in time required for charges to reach the avalanche multiplication region 140. FIG. 9A and FIG. 9B illustrate the full width at half maximum (FWHM) as an index of the time variation. The cause of the time variation is, for example, lattice scattering or ionized impurity scattering. Here, it is assumed that the time variation (the full width at half maximum FWHM ($e_c$)) until the charge $e_c$ reaches the avalanche multiplication region 140 and the time variation (the full width at half maximum FWHM ($e_d$)) until the charge $e_d$ reaches the avalanche multiplication region 140 are equivalent to each other.

As indicated by the broken arrows in FIG. 8A and FIG. 8B, under the potential distribution of FIG. 8B, the movement distance until the charge $e_d$ reaches the avalanche multiplication region 140 from the region D is longer than the movement distance until the charge $e_c$ reaches the avalanche multiplication region 140 from the region C. In other words, the time T4 required for the charge $e_d$ to reach the avalanche multiplication region 140 is longer than the time T3 required for the charge $e_c$ to reach the avalanche multiplication region 140. Therefore, the frequency distribution of the time required for the charge $e_d$ to reach the avalanche multiplication region 140 is shifted in a longer time direction than the frequency distribution of the time required for the charge $e_c$ to reach the avalanche multiplication region 140.

Therefore, when the time required for the charge $e_c$ generated in the region C and the charge $e_d$ generated in the region D to reach the avalanche multiplication region 140 is represented by one frequency distribution, the full width at half maximum FWHM ($e_c$+$e_d$) of the frequency distribution widens as illustrated in FIG. 9B. As described above, when there is a time difference between the time T3 and the time T4, the full width at half maximum FWHM ($e_c$+$e_d$) in the frequency distribution after addition is larger than the full width at half maximum FWHM ($e_c$) and FWHM ($e_d$) in each frequency distribution before addition. Further, as the time difference between the time T3 and the time T4 increases, the full width at half maximum FWHM ($e_c+e_d$) in the frequency distribution after addition increases. The time variation represented by the full width at half maximum FWHM ($e_c+e_d$) of the frequency distribution is one of the factors relating to the response performance of the sensor, e.g., time resolution in ranging applications, and is desired to be smaller.

Figure 10A:
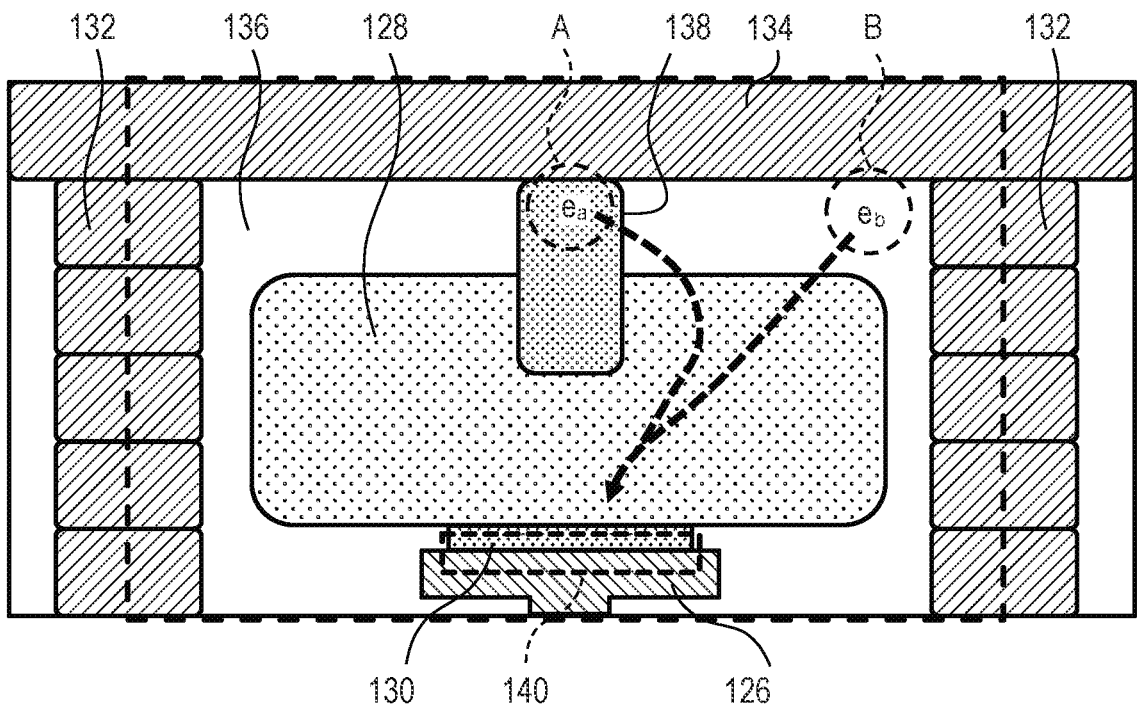
FIG. 10A and FIG. 10B are diagrams illustrating a potential distribution and a charge transfer path inside the photoelectric conversion element of the photoelectric conversion device according to the first embodiment of the present invention.
Figure 10B:
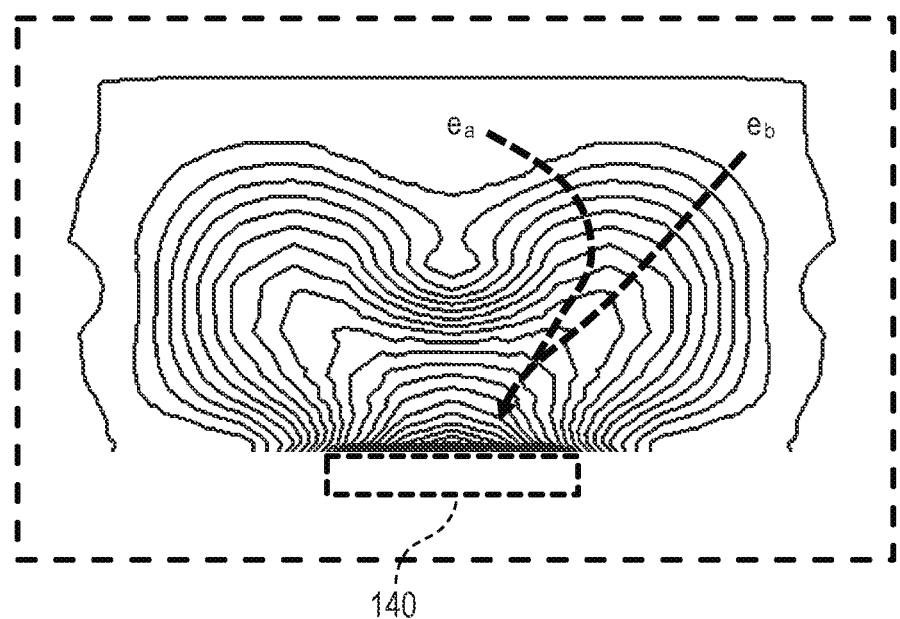

FIG. 10A is a schematic cross-sectional view illustrating the photoelectric conversion element 22 according to the present embodiment. As described above, the photoelectric conversion element 22 according to the present embodiment further includes the p-type semiconductor region 138 in comparison with the photoelectric conversion element of the reference example. FIG. 10B is a diagram illustrating a result obtained by simulation of a potential distribution in a region enclosed by a broken line in FIG. 10A.

In the photoelectric conversion element 22 according to the present embodiment, a region A and a region B corresponding to the region C and the region D assumed in the photoelectric conversion element of the reference example are assumed. Then, it is assumed that charge $e_a$ is generated in the region A and charge $e_b$ is generated in the region B by incidence of light. In the photoelectric conversion element 22 according to the present embodiment, the region A where the charge $e_a$ is generated overlaps with the region where the p-type semiconductor region 138 is provided.

When the photoelectric conversion element 22 is driven, a predetermined reverse bias voltage is applied between the p-type semiconductor regions 132 and 134 and the n-type semiconductor region 126. Thereby, a potential distribution as illustrated in FIG. 10B is formed in the n-type semiconductor region 128 and the semiconductor region 136. The potential gradient formed in the n-type semiconductor region 128 and the semiconductor region 136 in this manner is lower in the direction from the peripheral portion of the semiconductor region 136 toward the avalanche multiplication region 140 with respect to the signal charges as a whole.

However, in the photoelectric conversion element 22 according to the present embodiment, at the same depth where the n-type semiconductor region 128 and the p-type semiconductor region 138 are arranged, the potential of the p-type semiconductor region 138 with respect to the signal charge is higher than the potential of the n-type semiconductor region 128 with respect to the signal charge. In other words, in the photoelectric conversion element 22 according to the present embodiment, since the p-type semiconductor region 138 is provided, the potential gradient of this portion is smoother than the potential gradient of the corresponding portion in the photoelectric conversion element of the reference example. Since the signal charge is guided to a portion where the potential gradient is steeper, the charge $e_a$ generated in the region A is drawn in the direction of the avalanche multiplication region 140 by bypassing the center portion of the gentle potential gradient and passing through the peripheral portion, for example, as indicated by the broken arrows in FIG. 10A and FIG. 10B. That is, in the photoelectric conversion element 22 according to the present embodiment, the time required for the charge $e_a$ generated in the region A to reach the avalanche multiplication region 140 is longer than the time required for the charge $e_c$ generated in the region C to reach the avalanche multiplication region 140 in the photoelectric conversion element of the reference example.

Figure 11A:
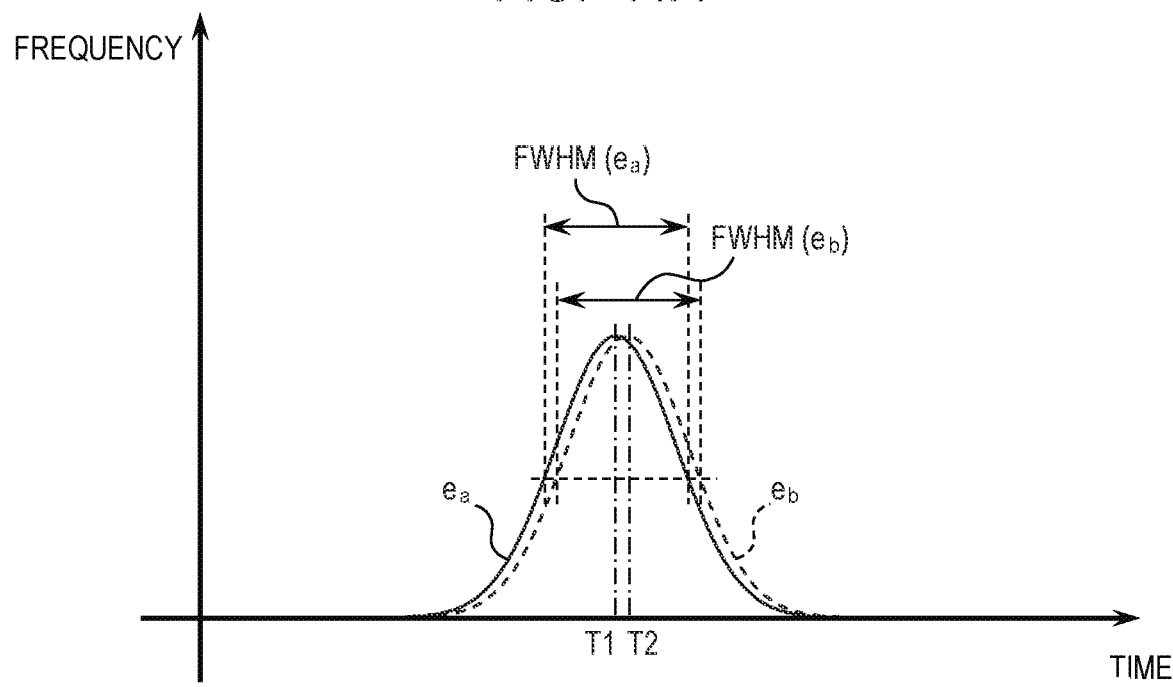
FIG. 11A, FIG. 11B, and FIG. 12B illustrate frequency distributions of time required to reach an avalanche multiplication region for charges generated in the photoelectric conversion element of the photoelectric conversion device according to the first embodiment of the present invention.
Figure 11B:
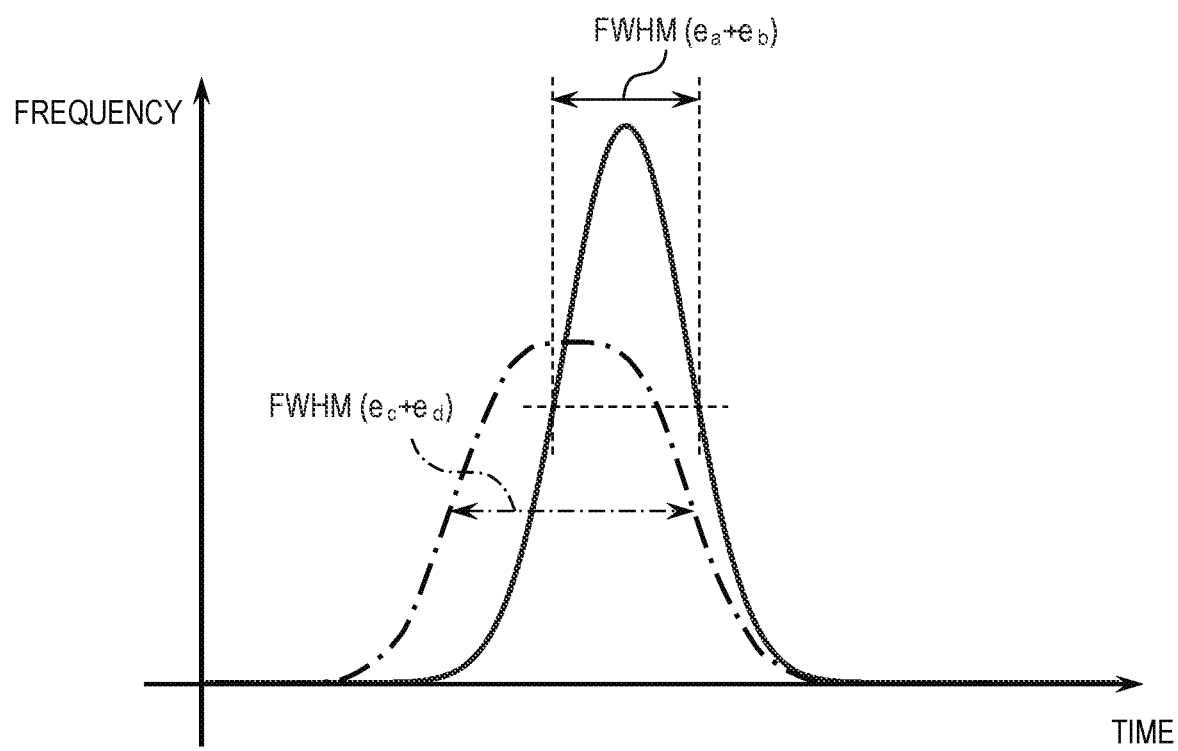

As a result, as illustrated in FIG. 11A, the difference between the time T1 required for the charge $e_a$ to reach the avalanche multiplication region 140 and the time T2 required for the charge $e_b$ to reach the avalanche multiplication region 140 is smaller than the difference between the time T3 and the time T4. As illustrated in FIG. 11B, the full width at half maximum FWHM ($e_a+e_b$) when the time required for the charges $e_a$ and $e_b$ to reach the avalanche multiplication region 140 is represented by one frequency distribution is narrower than the full width at half maximum FWHM ($e_c+e_d$).

Therefore, according to the photoelectric conversion element 22 according to the present embodiment, as compared with the photoelectric conversion element of the reference example, it is possible to reduce variation in time required for charges generated according to incident light to reach the avalanche multiplication region 140.

As described above, the photoelectric conversion element 22 according to the present embodiment may include the microlens 196. When the photoelectric conversion element 22 includes the microlens 196, the incident light is focused on the center portion of the photoelectric conversion element 22 by the microlens 196. Although the description of FIG. 8A to FIG. 11B is based on the assumption that the frequency of generation of charges in the center portion and the peripheral portion of the photoelectric conversion element 22 is the same, the configuration of the present embodiment is also effective in the case where the photoelectric conversion element 22 includes the microlens 196.

Figure 12A:
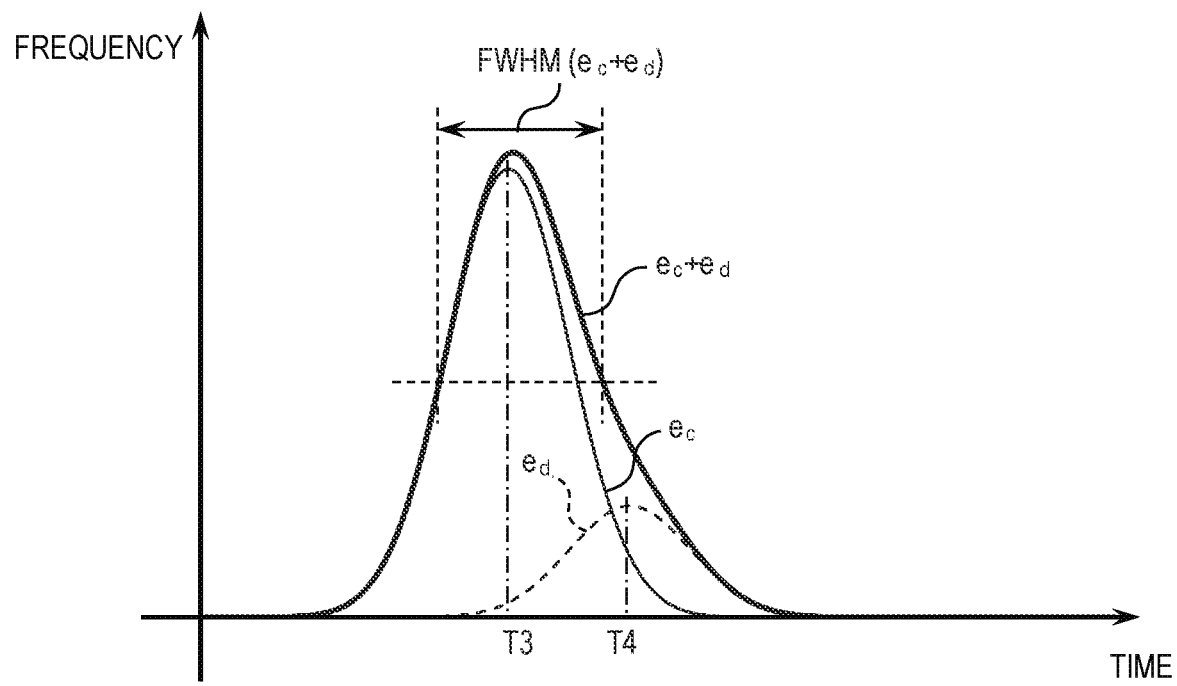
Figure 12B:
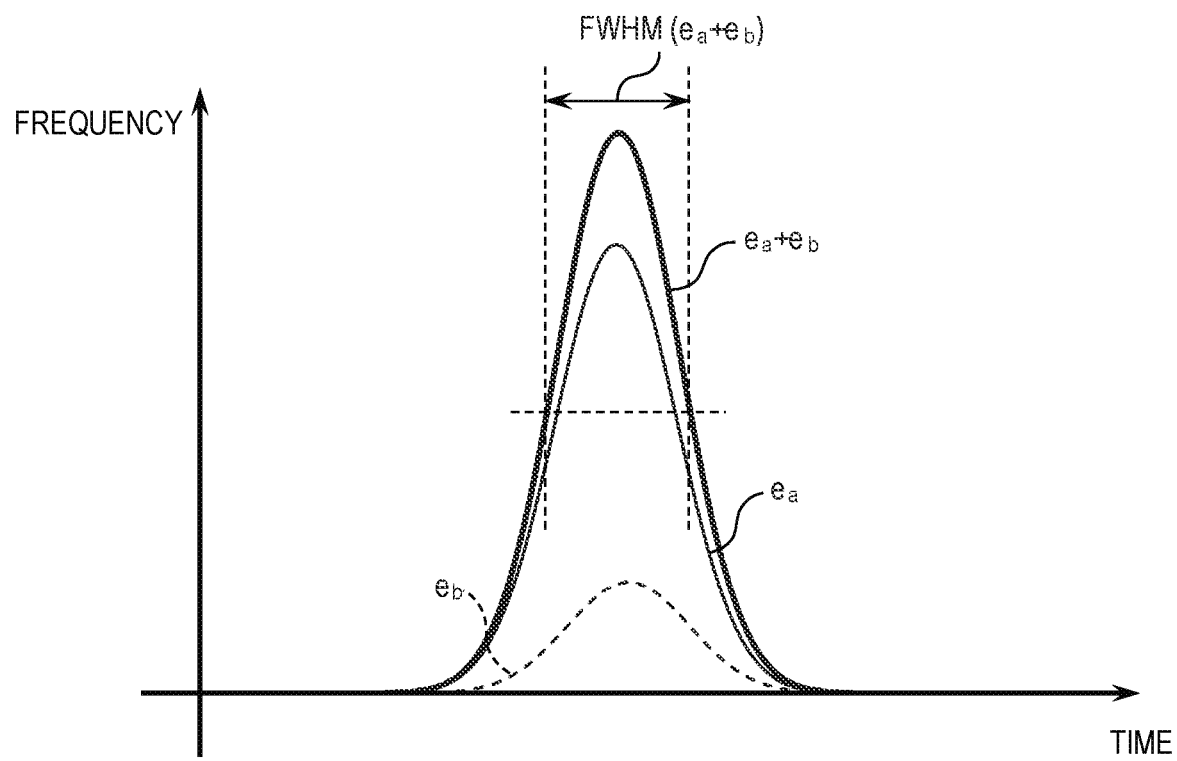

FIG. 12A and FIG. 12B are frequency distributions (probability distributions) of time required for charges generated in the photoelectric conversion element to reach the avalanche multiplication region when the photoelectric conversion element includes the microlens. FIG. 12A illustrates the case of the photoelectric conversion element according to the reference example, and FIG. 12B illustrates the case of the photoelectric conversion element 22 according to the present embodiment.

FIG. 12A illustrates a frequency distribution (a thin solid line) of the time required for the charge $e_c$ generated in the region C to reach the avalanche multiplication region 140, and a frequency distribution (a broken line) of the time required for the charge $e_d$ generated in the region D to reach the avalanche multiplication region 140. FIG. 12A also illustrates a frequency distribution (thick solid line) obtained by summing these. In FIG. 12A, it is assumed that the ratio of the generation frequency of the charge $e_c$ in the region C to the generation frequency of the charge $e_d$ in the region D is 8:2, and the full width at half maximum FWHM ($e_c$) and the full width at half maximum FWHM ($e_d$) are equal to each other. FIG. 12B illustrates a frequency distribution (a thin solid line) of the time required for the charge $e_a$ generated in the region A to reach the avalanche multiplication region 140 and a frequency distribution (a broken line) of the time required for the charge $e_b$ generated in the region B to reach the avalanche multiplication region 140. FIG. 12B also illustrates a frequency distribution (thick solid line) obtained by summing these. In FIG. 12B, it is assumed that the ratio of the frequency of generation of the charge $e_a$ in the region A to the frequency of generation of the charge $e_b$ in the region D is 8:2, and the full width at half maximum FWHM ($e_a$) and the full width at half maximum FWHM ($e_b$) are equal to each other.

In the case of the photoelectric conversion element according to the reference example, between the peak position of the frequency distribution of the charge $e_c$ and the peak position of the frequency distribution of the charge $e_d$, as described above, there is a time difference (T4−T3) corresponding to the difference in the moving distance of the signal charges to the avalanche multiplication region 140. Therefore, the frequency distribution ($e_c+e_d$) obtained by summing the frequency distribution of the charge $e_c$ and the frequency distribution of the charge $e_d$ becomes a broader distribution than the frequency distribution of the charge $e_c$ by a time difference corresponding to the difference in the moving distance between the charge $e_c$ and the charge $e_d$, as illustrated by a thick solid line in FIG. 12A.

On the other hand, in the case of the photoelectric conversion element 22 according to the present embodiment, the difference between the peak position of the frequency distribution of the charge $e_a$ and the peak position of the frequency distribution of the charge $e_b$ is smaller than that in the case of the photoelectric conversion element of the reference example as described above. Therefore, the full width at half maximum FWHM ($e_a+e_b$) of the frequency distribution ($e_a+e_b$) obtained by adding the frequency distribution of the charge $e_a$ and the frequency distribution of the charge $e_b$ becomes narrower than the full width at half maximum FWHM ($e_c+e_d$) of the frequency distribution ($e_c+e_d$).

Therefore, in the photoelectric conversion element 22 according to the present embodiment, even in the case where the photoelectric conversion element 22 includes the microlens 196, it is possible to reduce variation in time required for charges generated according to incident light to reach the avalanche multiplication region.

As described above, according to the present embodiment, it is possible to realize a photoelectric conversion element and a photoelectric conversion device excellent in high-speed response.

Second Embodiment

Figure 13:
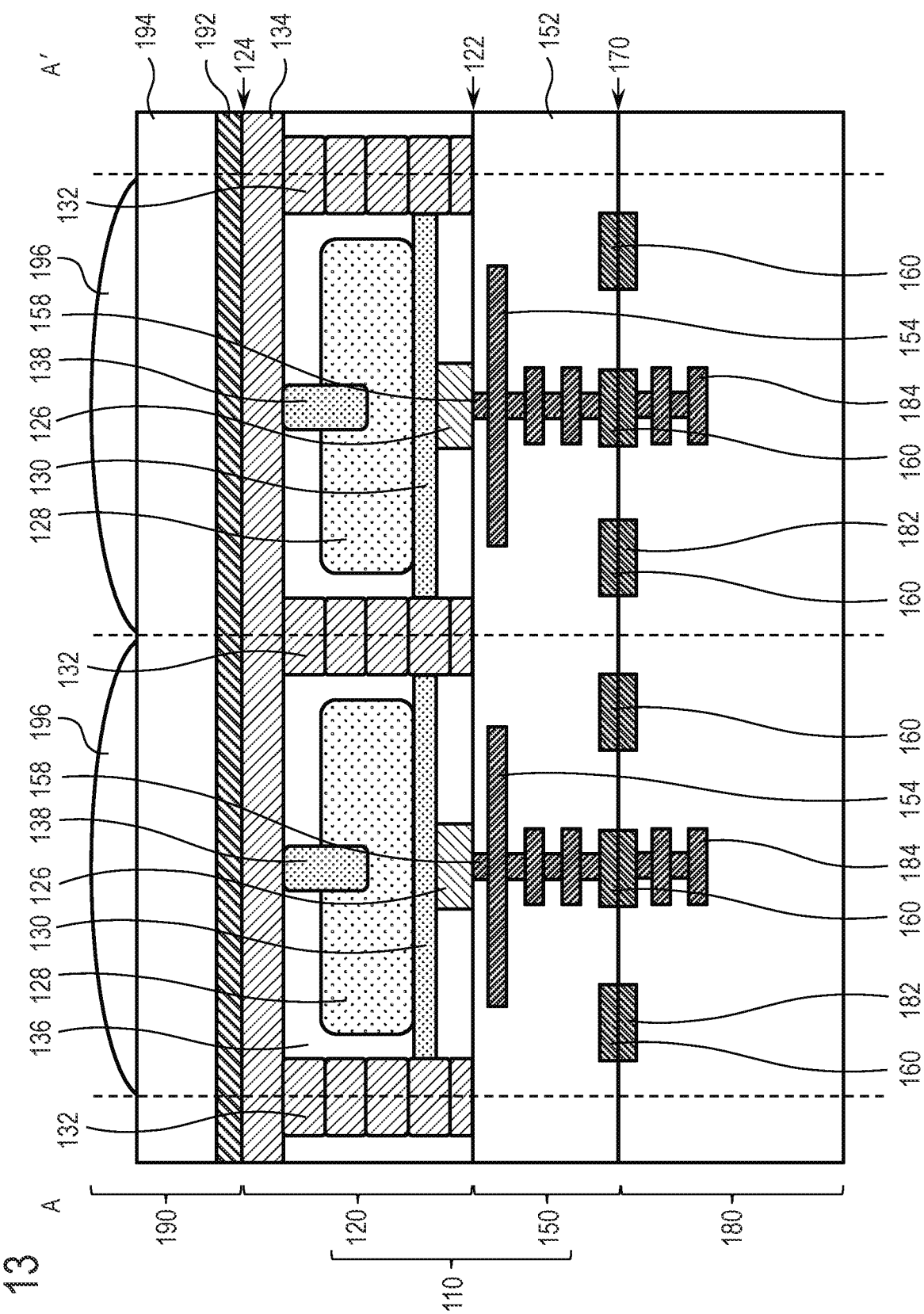
FIG. 13 is a schematic cross-sectional view illustrating a structure of a photoelectric conversion element of a photoelectric conversion device according to a second embodiment of the present invention.

A photoelectric conversion device according to a second embodiment of the present invention will be described with reference to FIG. 13. Components similar to those of the photoelectric conversion device according to the first embodiment are denoted by the same reference numerals, and description thereof will be omitted or simplified. FIG. 13 is a schematic cross-sectional view illustrating a configuration example of a photoelectric conversion element in the photoelectric conversion device according to the present embodiment.

The photoelectric conversion device according to the present embodiment is the same as the photoelectric conversion device according to the first embodiment except that the configuration of the photoelectric conversion element 22 is different. In the present embodiment, portions of the photoelectric conversion element 22 according to the present embodiment which are different from the photoelectric conversion element 22 of the first embodiment will be mainly described, and a description of portions common to the photoelectric conversion element 22 according to the first embodiment will be appropriately omitted.

Also in the photoelectric conversion device according to the present embodiment, one photoelectric conversion element 22 includes n-type semiconductor regions 126 and 128, p-type semiconductor regions 130, 132, 134 and 138, and a semiconductor region 136. Note that in the present embodiment, the conductivity type of the semiconductor region 136 is n-type. As illustrated in FIG. 13, the photoelectric conversion element 22 according to the present embodiment differs from the photoelectric conversion element 22 according to the first embodiment in the configurations of the n-type semiconductor region 126 and the p-type semiconductor region 130. That is, in the photoelectric conversion element 22 according to the present embodiment, the area of the n-type semiconductor region 126 in the plan view is smaller than the area of the p-type semiconductor region 130 in the plan view, and the n-type semiconductor region 126 is disposed at the center of the p-type semiconductor region 130 in the plan view. The outer peripheral portion of the p-type semiconductor region 130 in the plan view is in contact with the p-type semiconductor region 132.

By configuring the photoelectric conversion element 22 in this manner, more charges may be collected in the avalanche multiplication region at the center portion where the n-type semiconductor region 126 and the p-type semiconductor region 130 are in contact with each other, and the sensitivity may be improved as compared with the photoelectric conversion element 22 according to the first embodiment. According to this configuration, since the avalanche multiplication region may be reduced, it is possible to reduce noise caused by the strong electric field.

On the other hand, in the photoelectric conversion element 22 according to the present embodiment, as the avalanche multiplication region becomes smaller, a difference is likely to occur between the time until the charge generated in the center portion reaches the avalanche multiplication region and the time until the charge generated in the outer peripheral portion reaches the avalanche multiplication region. However, in the photoelectric conversion element 22 according to the present embodiment, similarly to the photoelectric conversion element 22 according to the first embodiment, since the p-type semiconductor region 138 is disposed in the center portion, charges may be propagated to the avalanche multiplication region so as to pass through the peripheral portion by bypassing the center portion. This makes it possible to reduce the time variation between the time required for the charge generated in the center portion to reach the avalanche multiplication region and the time required for the charge generated in the peripheral portion to reach the avalanche multiplication region to approximately the same level as the photoelectric conversion element 22 of the first embodiment.

That is, according to the configuration of the present embodiment, it is possible to reduce variation in time required for charges generated in response to incidence of light to reach the avalanche multiplication region while improving sensitivity and reducing noise with respect to the photoelectric conversion element according to the first embodiment.

As described above, according to the present embodiment, it is possible to realize a photoelectric conversion element and a photoelectric conversion device excellent in high-speed response.

Third Embodiment

Figure 14:
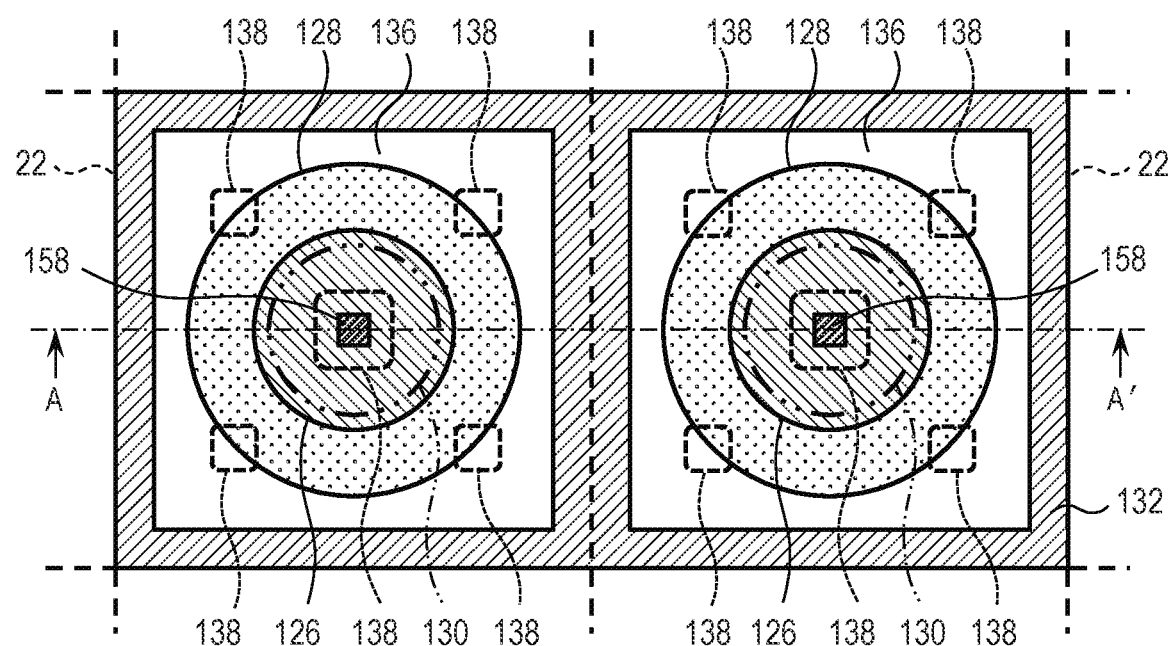
FIG. 14 is a plan view illustrating a structure of a photoelectric conversion element of a photoelectric conversion device according to a third embodiment of the present invention.

A photoelectric conversion device according to a third embodiment of the present invention will be described with reference to FIG. 14. Components similar to those of the photoelectric conversion devices according to the first and second embodiments are denoted by the same reference numerals, and description thereof will be omitted or simplified. FIG. 14 is a plan view illustrating a configuration example of a photoelectric conversion element in the photoelectric conversion device according to the present embodiment.

The photoelectric conversion device according to the present embodiment is the same as the photoelectric conversion device according to the first embodiment except that the configuration of the photoelectric conversion element 22 is different. In the present embodiment, portions of the photoelectric conversion element 22 according to the present embodiment which are different from the photoelectric conversion element 22 according to the first embodiment will be mainly described, and a description of portions common to the photoelectric conversion element 22 according to the first embodiment will be appropriately omitted.

The photoelectric conversion element 22 according to the present embodiment differs from the photoelectric conversion element 22 according to the first embodiment in that a plurality of p-type semiconductor regions 138 is provided as illustrated in FIG. 14. That is, in the photoelectric conversion element 22 according to the first embodiment, one p-type semiconductor region 138 is disposed at the center portion of the photoelectric conversion element 22 in the plan view. On the other hand, in the photoelectric conversion element 22 according to the present embodiment, four p-type semiconductor regions 138 arranged in two diagonal directions are further arranged so as to sandwich the p-type semiconductor regions 138 arranged in the center portion in the plan view. The four p-type semiconductor regions 138 are disposed between the p-type semiconductor region 138 and the p-type semiconductor region 132 at the center in the plan view. The area of the p-type semiconductor regions 138 arranged in the four corners in the plan view is smaller than the area of the p-type semiconductor region 138 arranged in the center portion in the plan view.

By disposing the p-type semiconductor regions 138 also in portions other than the center portion in the plan view, it is possible to more appropriately control the time required for the signal charges generated in each portion of the photoelectric conversion element 22 to reach the avalanche multiplication region. For example, by reducing the area and density of the p-type semiconductor regions 138 in the plan view from the center portion toward the peripheral portion, the bypass path may be made longer as the signal charge generated near the center portion becomes larger. In particular, when the arrangement interval (pitch) of the photoelectric conversion elements 22 (or the pixels 12) is larger than the thickness of the semiconductor layer 120, it is effective to arrange a plurality of p-type semiconductor regions 138 or to increase the area of the p-type semiconductor region 138 at the center portion.

The arrangement of the p-type semiconductor regions 138 in the plan view is preferably appropriately selected according to the size, shape, and the like of the photoelectric conversion element 22 so that the variation in the time required for the signal charge generated in each portion of the photoelectric conversion element 22 to reach the avalanche multiplication region is reduced.

As described above, according to the present embodiment, it is possible to realize a photoelectric conversion element and a photoelectric conversion device excellent in high-speed response.

Fourth Embodiment

Figure 15:
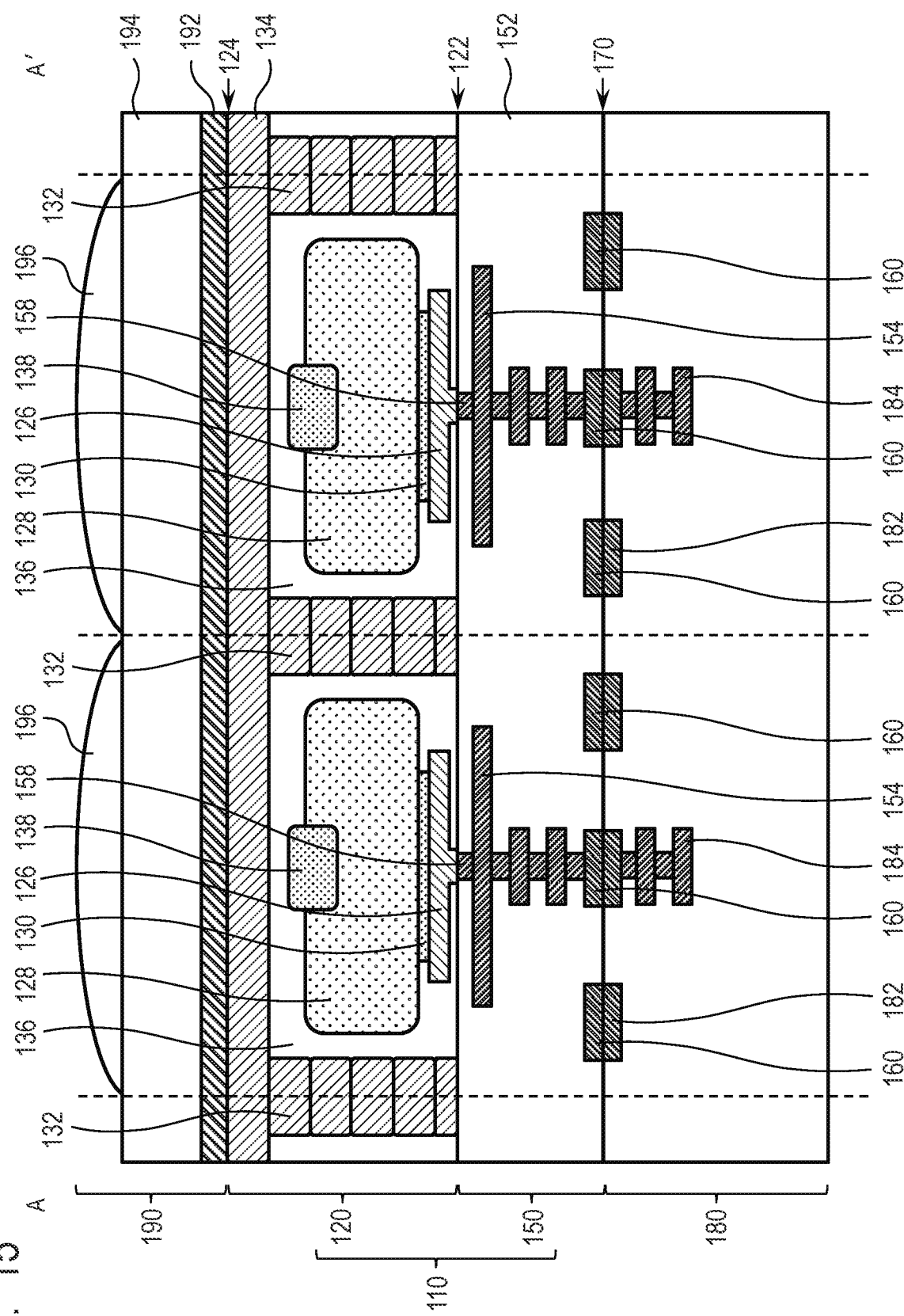
FIG. 15 is a schematic cross-sectional view illustrating a structure of a photoelectric conversion element of a photoelectric conversion device according to a fourth embodiment of the present invention.

A photoelectric conversion device according to a fourth embodiment of the present invention will be described with reference to FIG. 15. Components similar to those of the photoelectric conversion devices according to the first to third embodiments are denoted by the same reference numerals, and description thereof will be omitted or simplified. FIG. 15 is a schematic cross-sectional view illustrating a configuration example of a photoelectric conversion element in the photoelectric conversion device according to the present embodiment.

The photoelectric conversion device according to the present embodiment is the same as the photoelectric conversion device according to the first embodiment except that the configuration of the photoelectric conversion element 22 is different. In the present embodiment, portions of the photoelectric conversion element 22 according to the present embodiment which are different from the photoelectric conversion element 22 according to the first embodiment will be mainly described, and a description of portions common to the photoelectric conversion element 22 of the first embodiment will be appropriately omitted.

As illustrated in FIG. 15, the photoelectric conversion element 22 according to the present embodiment differs from the photoelectric conversion element 22 according to the first embodiment in the arrangement of the p-type semiconductor region 138 in the semiconductor layer 120. That is, in the photoelectric conversion element 22 according to the first embodiment, the p-type semiconductor region 138 is disposed such that the long side direction in the cross-sectional view is parallel to the depth direction. On the other hand, in the photoelectric conversion element 22 according to the present embodiment, the p-type semiconductor region 138 is disposed such that the long side direction in the cross-sectional view is perpendicular to the depth direction.

Depending on the size and shape of the photoelectric conversion element 22, by disposing the p-type semiconductor region 138 such that the long side direction in the cross-sectional view is perpendicular to the depth direction, the propagation path of charges generated in the center portion may be made longer. In such a case, by applying the configuration of the present embodiment, it is possible to further reduce the variation in time until the signal charges generated in the respective portions of the photoelectric conversion element 22 reach the avalanche multiplication region.

Similarly to the planar layout of the p-type semiconductor regions 138 described in the third embodiment, the cross-sectional shape of the p-type semiconductor region 138 is preferably appropriately selected according to the size, shape, and the like of the photoelectric conversion element 22. When a plurality of p-type semiconductor regions 138 are arranged as described in the third embodiment, the plurality of p-type semiconductor regions 138 may have different cross-sectional shapes. The p-type semiconductor region 138 is not necessarily in contact with the p-type semiconductor region 134, and may be isolated from the p-type semiconductor region 134 as illustrated in FIG. 15.

As described above, according to the present embodiment, it is possible to realize a photoelectric conversion element and a photoelectric conversion device excellent in high-speed response.

Fifth Embodiment

Figure 16:
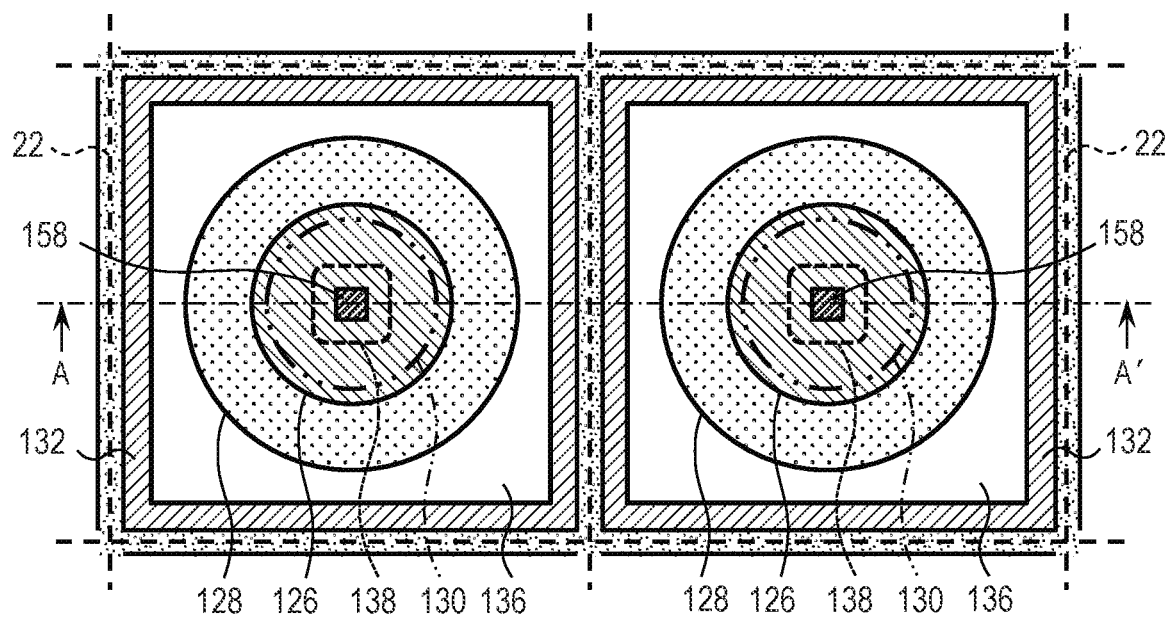
FIG. 16 and FIG. 17 are plan views illustrating a structure of a photoelectric conversion element in a photoelectric conversion device according to a fifth embodiment of the present invention.
Figure 17:
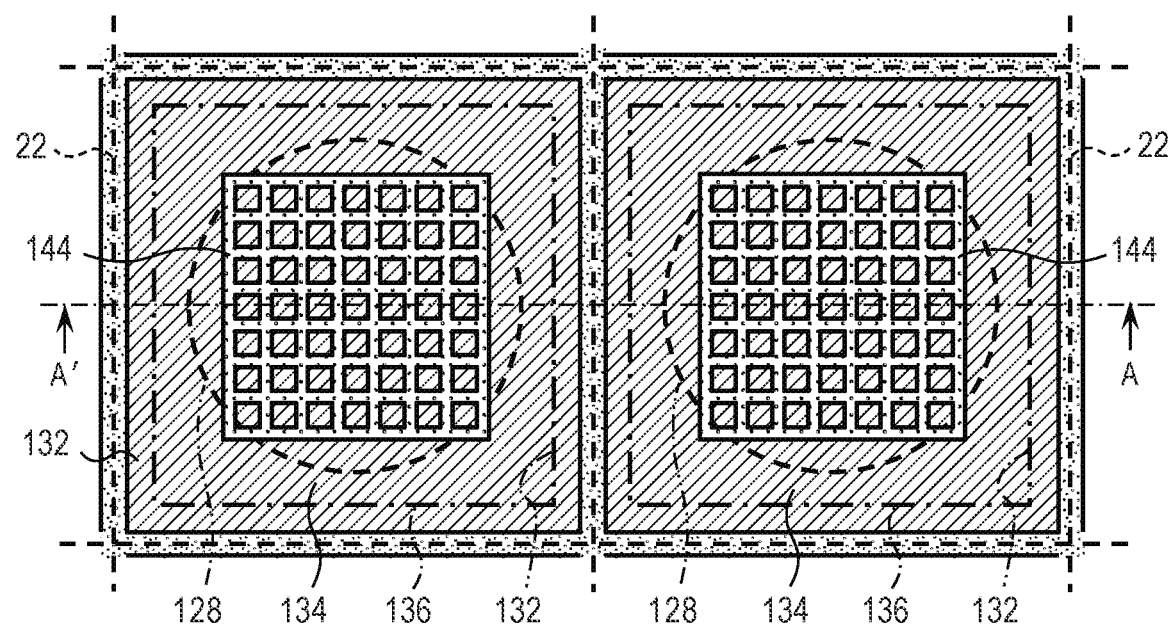
Figure 18:
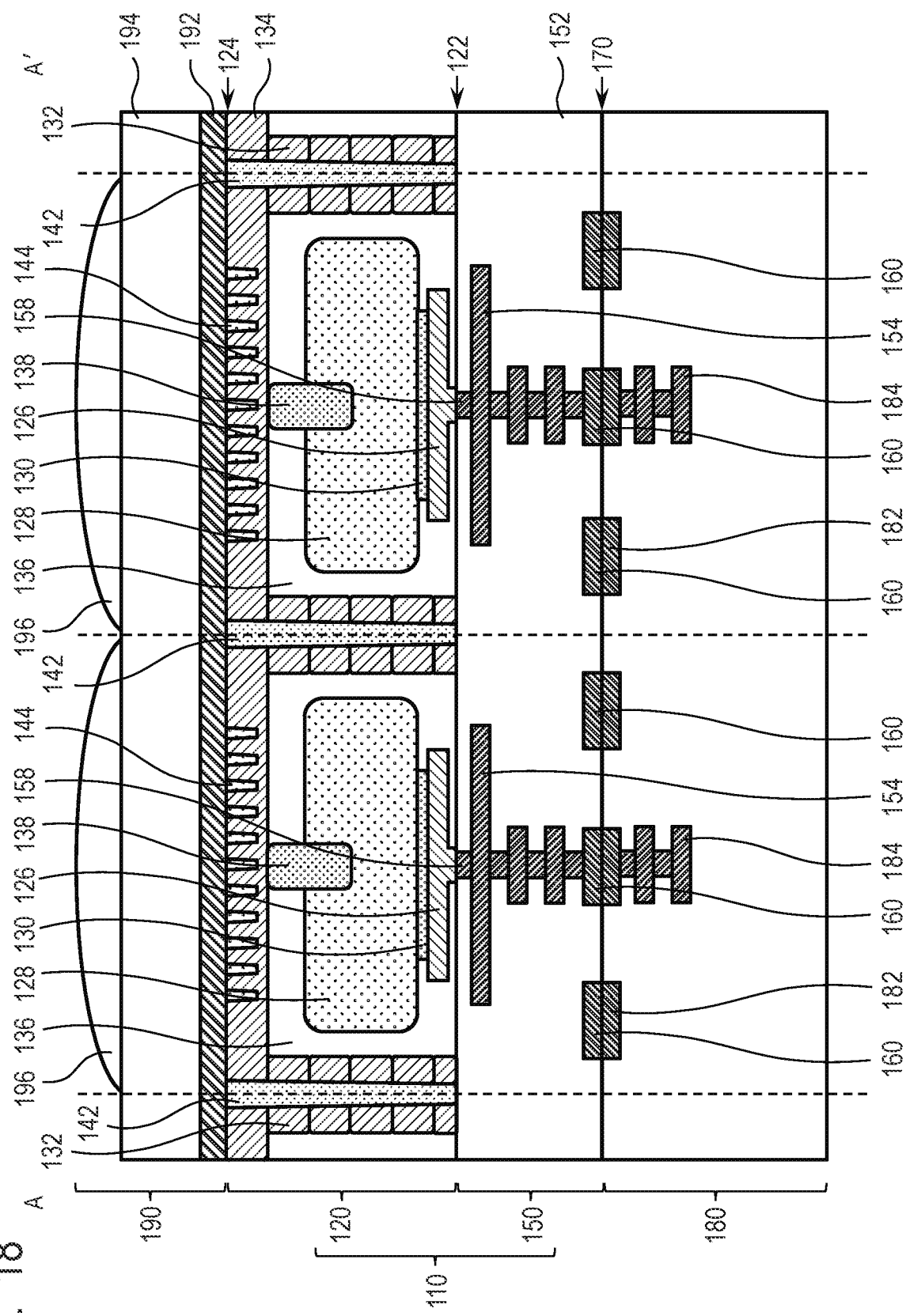
FIG. 18 is a schematic cross-sectional view illustrating a structure of the photoelectric conversion element of the photoelectric conversion device according to the fifth embodiment of the present invention.
Figure 19:
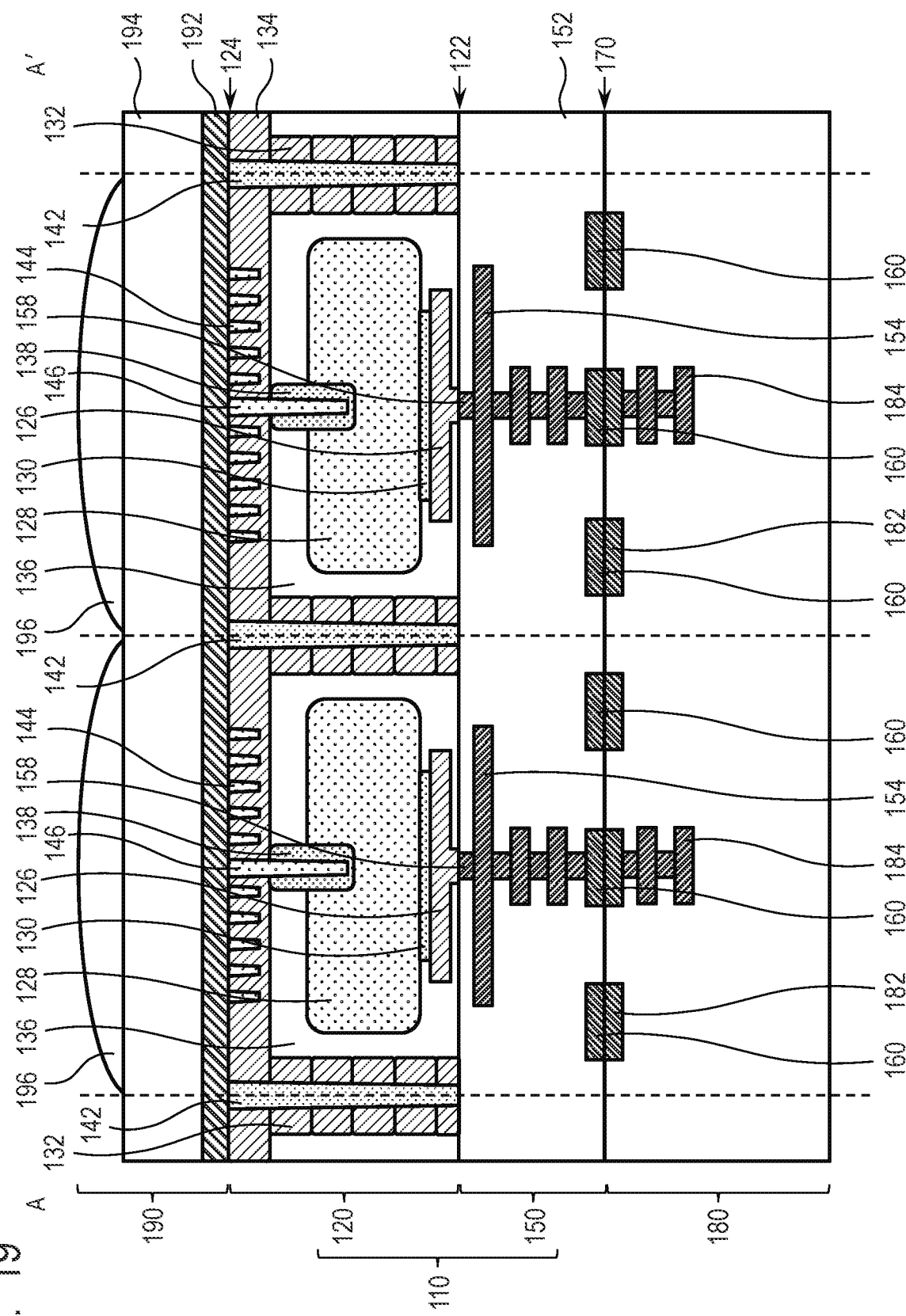
FIG. 19 is a schematic cross-sectional view illustrating a structure of a photoelectric conversion element of a photoelectric conversion device according to a modified example of the fifth embodiment of the present invention.

A photoelectric conversion device according to a fifth embodiment of the present invention will be described with reference to FIG. 16 to FIG. 19. Components similar to those of the photoelectric conversion devices according to the first to fourth embodiments are denoted by the same reference numerals, and description thereof will be omitted or simplified. FIG. 16 and FIG. 17 are plan views illustrating a configuration example of a photoelectric conversion elements in the photoelectric conversion device according to the present embodiment. FIG. 18 is a schematic cross-sectional view illustrating the configuration example of the photoelectric conversion element in the photoelectric conversion device according to the present embodiment. FIG. 19 is a schematic cross-sectional view illustrating a configuration example of a photoelectric conversion element in a photoelectric conversion device according to a modified example of the present embodiment.

The photoelectric conversion device according to the present embodiment is the same as the photoelectric conversion device according to the first embodiment except that the configuration of the photoelectric conversion element 22 is different. In the present embodiment, portions of the photoelectric conversion element 22 according to the present embodiment which are different from the photoelectric conversion element 22 according to the first embodiment will be mainly described, and a description of portions common to the photoelectric conversion element 22 according to the first embodiment will be appropriately omitted.

FIG. 16 and FIG. 17 illustrate two photoelectric conversion elements 22 arranged adjacent to each other among the plurality of pixels 12 constituting the pixel region 10. FIG. 16 is a plan view of the semiconductor layer 120 viewed from the side of the first surface 122, and FIG. 17 is a plan view of the semiconductor layer 120 viewed from the side of the second surface 124. FIG. 18 is a cross-sectional view taken along the line A-A' of FIG. 16 and FIG. 17. Broken lines illustrated in FIG. 16 to FIG. 18 indicate boundaries between adjacent pixels 12 (photoelectric conversion elements 22).

As illustrated in FIG. 16 to FIG. 18, the photoelectric conversion element 22 according to the present embodiment is different from the photoelectric conversion element 22 according to the first embodiment in that the photoelectric conversion element 22 further includes an isolation structure 142 and a concave-convex structure 144.

The isolation structure 142 is provided in a region between the pixel 12 (photoelectric conversion element 22) and the pixel 12 (photoelectric conversion element 22) in the plan view so as to extend from the first surface 122 to the second surface 124 of the semiconductor layer 120. For example, the isolation structure 142 may be provided inside a region where the p-type semiconductor region 132 is disposed, as illustrated in FIG. 16 and FIG. 17. The isolation structure 142 has a role of preventing light from leaking into the adjacent photoelectric conversion elements 22, and is preferably a wall-shaped body surrounding each of the regions where the photoelectric conversion element 22 is arranged. The isolation structure 142 may be formed, for example, by filling an insulating member or a metal member in a groove formed in the semiconductor layer 120. Although the isolation structure 142 is provided so as to extend from the first surface 122 to the second surface 124 of the semiconductor layer 120 in the configuration examples of FIG. 16 and FIG. 17, the isolation structure 142 may not necessarily extend from the first surface 122 to the second surface 124.

The concave-convex structure 144 is provided on the second surface 124 of the semiconductor layer 120. FIG. 17 and FIG. 18 illustrate an example in which a lattice-shaped groove is formed on the second surface 124 of the semiconductor layer 120 as an example of the concave-convex structure 144. However, the concave-convex structure 144 has a role of scattering light incident from the side of the second surface 124 of the semiconductor layer 120, and the pattern of the concave-convex structure 144 is not particularly limited as long as the concave-convex structure 144 has a function of scattering light incident from the side of the second surface 124. The concave-convex structure 144 may be formed, for example, by filling an insulating member in a groove formed on the second surface 124 of the semiconductor layer 120.

By providing the isolation structure 142 and the concave-convex structure 144 in the semiconductor layer 120, light incident on the semiconductor layer 120 is scattered by the concave-convex structure 144 and confined in one pixel by the isolation structure 142. Thereby, the effective optical path length is extended, and the sensitivity may be improved. On the other hand, in comparison with the configuration in which light is condensed to the center of the pixel by the microlens 196, in the present embodiment, the probability of generation of charges in the vicinity of the boundary portion of the pixel 12 is relatively high. The increased probability of generation of charges in the vicinity of the boundary portion of the pixel 12 is likely to cause a time difference until the charges reach the avalanche multiplication region 140 with respect to charges generated in the vicinity of the center portion of the pixel 12.

However, also in the configuration of the present embodiment, by providing the p-type semiconductor region 138, charges may be propagated to the avalanche multiplication region 140 so as to pass through the peripheral portion by bypassing the center portion. Thus, the time variation until the charge reaches the avalanche multiplication region 140 may be reduced to the same level as in the first embodiment.

That is, according to the configuration of the present embodiment, the sensitivity may be improved with respect to the photoelectric conversion element according to the first embodiment, and variation in time required for charges generated in response to light incidence to reach the avalanche multiplication region may be reduced.

FIG. 19 is a schematic cross-sectional view illustrating a structure of a photoelectric conversion element according to a modified example of the present embodiment. In this modified example, a part of the concave-convex structure 144 (the concave-convex structure 146) is arranged to extend to the p-type semiconductor region 138. By arranging the concave-convex structures 144 and 146 in this manner, it is possible to reduce variation in time until the signal charges reach the avalanche multiplication region, similarly to the above description.

As described above, according to the present embodiment, it is possible to realize a photoelectric conversion element and a photoelectric conversion device excellent in high-speed response.

Sixth Embodiment

Figure 20:
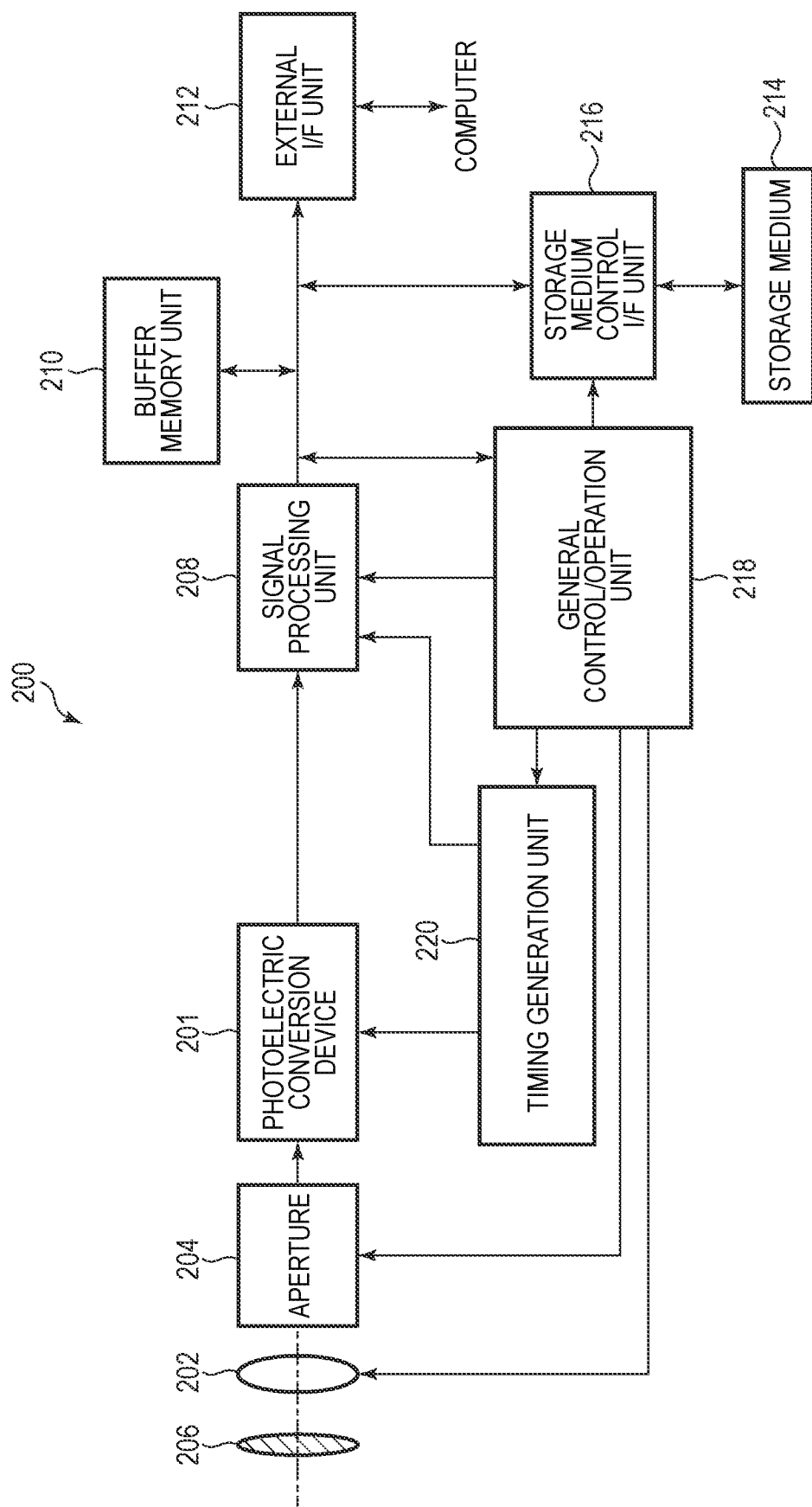
FIG. 20 is a block diagram illustrating a schematic configuration of a photodetection system according to a sixth embodiment of the present invention.

A photodetection system according to a sixth embodiment of the present invention will be described with reference to FIG. 20. FIG. 20 is a block diagram illustrating a schematic configuration of the photodetection system according to the present embodiment. In the present embodiment, a light detection sensor to which the photoelectric conversion device 100 described in any one of the first to fifth embodiments is applied will be described.

The photoelectric conversion device 100 described in the first to fifth embodiments may be applied to various photodetection systems. Examples of applicable photodetection systems include imaging systems such as digital still cameras, digital camcorders, surveillance cameras, copying machines, facsimiles, mobile phones, on-vehicle cameras, observation satellites, and the like. A camera module including an optical system such as a lens and an imaging device is also included in the photodetection system. FIG. 20 is a block diagram of a digital still camera as an example of these.

The photodetection system 200 illustrated in FIG. 20 includes a photoelectric conversion device 201, a lens 202 for forming an optical image of an object on the photoelectric conversion device 201, an aperture 204 for varying the amount of light passing through the lens 202, and a barrier 206 for protecting the lens 202. The lens 202 and the aperture 204 are optical systems for focusing light on the photoelectric conversion device 201. The photoelectric conversion device 201 is the photoelectric conversion device 100 described in any of the first to fifth embodiments, and converts an optical image formed by the lens 202 into image data.

The photodetection system 200 also includes a signal processing unit 208 that processes an output signal output from the photoelectric conversion device 201. The signal processing unit 208 generates image data from the digital signal output from the photoelectric conversion device 201. The signal processing unit 208 performs various corrections and compressions as necessary to output image data. The photoelectric conversion device 201 may include an AD conversion unit that generates a digital signal to be processed by the signal processing unit 208. The AD conversion unit may be formed on a semiconductor layer (semiconductor substrate) on which the photoelectric conversion element of the photoelectric conversion device 201 is formed, or may be formed on a semiconductor substrate different from the semiconductor layer on which the photoelectric conversion element of the photoelectric conversion device 201 is formed. The signal processing unit 208 may be formed on the same semiconductor substrate as the photoelectric conversion device 201.

The photodetection system 200 further includes a buffer memory unit 210 for temporarily storing image data, and an external interface unit (external I/F unit) 212 for communicating with an external computer or the like. Further, the photodetection system 200 includes a storage medium 214 such as a semiconductor memory for storing or reading out captured image data, and a storage medium control interface unit (storage medium control I/F unit) 216 for storing or reading out image data on or from the storage medium 214. The storage medium 214 may be built in the photodetection system 200, or may be detachable. Further, communication between the storage medium control I/F unit 216 and the storage medium 214 and communication from the external I/F unit 212 may be performed wirelessly.

Further, the photodetection system 200 includes a general control/operation unit 218 that controls various calculations and the entire digital still camera, and a timing generation unit 220 that outputs various timing signals to the photoelectric conversion device 201 and the signal processing unit 208. Here, the timing signal or the like may be input from the outside, and the photodetection system 200 may include at least the photoelectric conversion device 201 and a signal processing unit 208 that processes an output signal output from the photoelectric conversion device 201. The timing generation unit 220 may be mounted on the photoelectric conversion device 201. Further, the general control/operation unit 218 and the timing generation unit 220 may be configured to implement some or all of the control functions of the photoelectric conversion device 201.

The photoelectric conversion device 201 outputs an imaging signal to the signal processing unit 208. The signal processing unit 208 performs predetermined signal processing on the imaging signal output from the photoelectric conversion device 201, and outputs image data. The signal processing unit 208 generates an image using the imaging signal. The signal processing unit 208 may be configured to perform a distance measurement operation on a signal output from the photoelectric conversion device 201.

As described above, according to the present embodiment, by configuring the photodetection system using the photoelectric conversion device according to the first to the fifth embodiments, it is possible to realize a photodetection system capable of obtaining a higher quality image.

Seventh Embodiment

Figure 21:
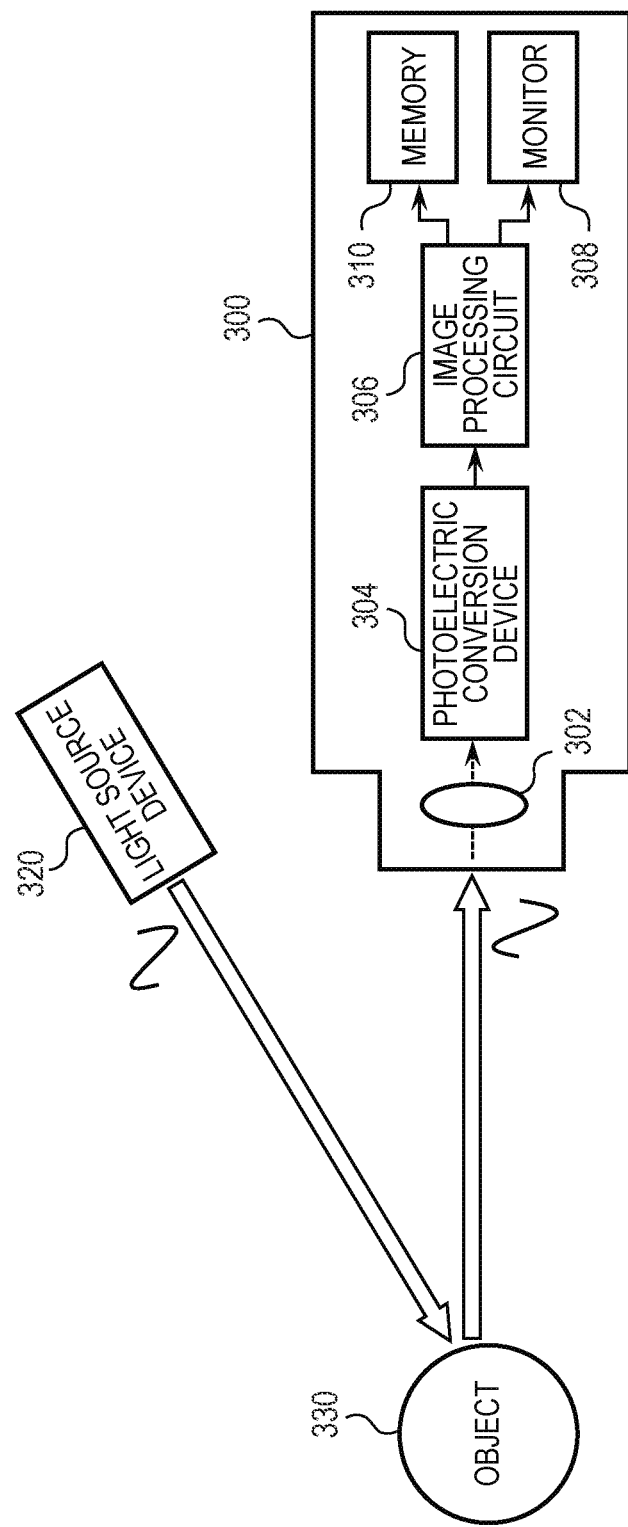
FIG. 21 is a block diagram illustrating a schematic configuration of a range image sensor according to a seventh embodiment of the present invention.

A range image sensor according to a seventh embodiment of the present invention will be described with reference to FIG. 21. FIG. 21 is a block diagram illustrating a schematic configuration of the range image sensor according to the present embodiment. In the present embodiment, a range image sensor will be described as an example of a photodetection system to which the photoelectric conversion device 100 described in any one of the first to fifth embodiments is applied.

As illustrated in FIG. 21, the range image sensor 300 according to the present embodiment may include an optical system 302, a photoelectric conversion device 304, an image processing circuit 306, a monitor 308, and a memory 310. The range image sensor 300 receives light (modulated light or pulse light) emitted from the light source device 320 toward the object 330 and reflected by the surface of the object 330, and acquires a distance image corresponding to the distance to the object 330.

The optical system 302 includes one or a plurality of lenses, and has a role of forming an image of image light (incident light) from the object 330 on a light receiving surface (sensor unit) of the photoelectric conversion device 304.

The photoelectric conversion device 304 is the photoelectric conversion device 100 described in any of the first to fifth embodiments, and has a function of generating a distance signal indicating the distance to the object 330 based on the image light from the object 330 and supplying the generated distance signal to the image processing circuit 306.

The image processing circuit 306 has a function of performing image processing for constructing a distance image based on the distance signal supplied from the photoelectric conversion device 304.

The monitor 308 has a function of displaying a distance image (image data) obtained by image processing in the image processing circuit 306. The memory 310 has a function of storing (recording) a distance image (image data) obtained by image processing in the image processing circuit 306.

As described above, according to the present embodiment, by configuring the range image sensor using the photoelectric conversion devices of the first to fifth embodiments, it is possible to realize a range image sensor capable of acquiring a distance image including more accurate distance information in conjunction with improvement in characteristics of the pixels 12.

Eighth Embodiment

Figure 22:
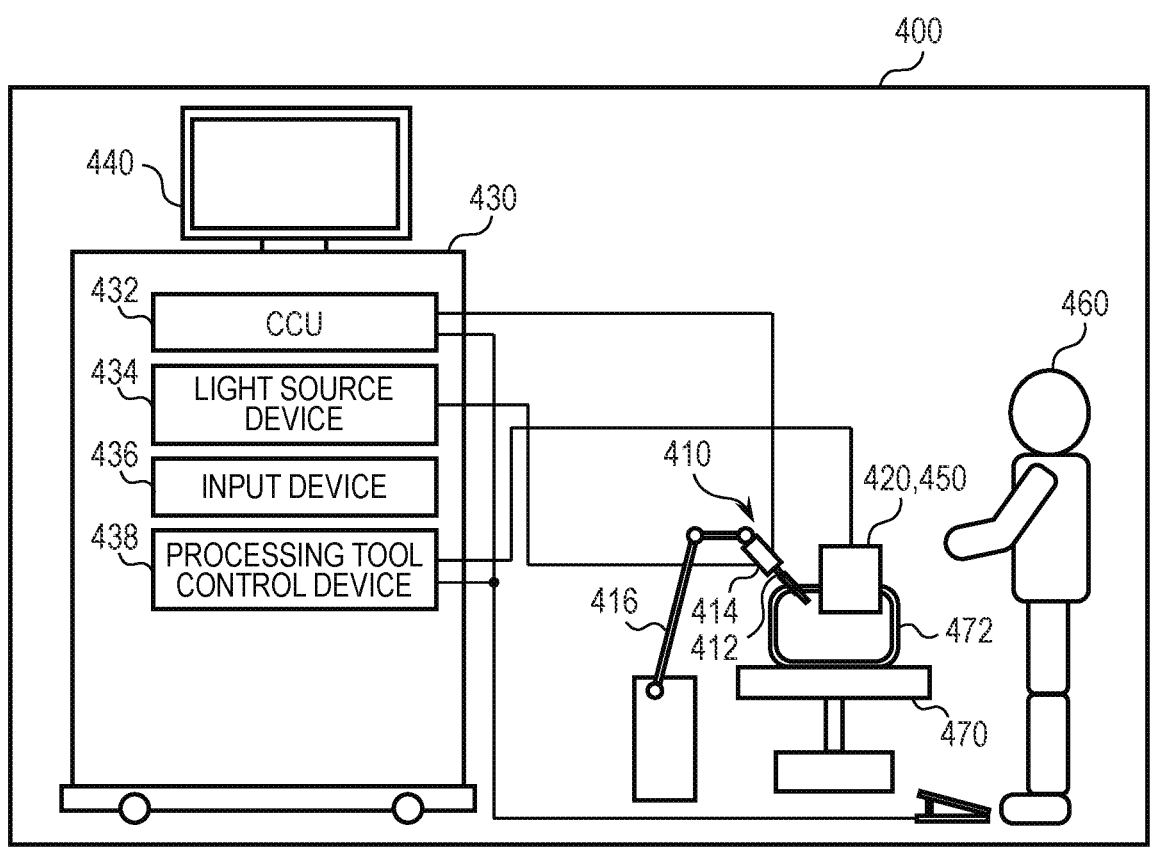
FIG. 22 is a schematic diagram illustrating a configuration example of an endoscopic surgical system according to an eighth embodiment of the present invention.

An endoscopic surgical system according to an eighth embodiment of the present invention will be described with reference to FIG. 22. FIG. 22 is a schematic diagram illustrating a configuration example of the endoscopic surgical system according to the present embodiment. In the present embodiment, an endoscopic surgical system will be described as an example of a photodetection system to which the photoelectric conversion device 100 described in any one of the first to fifth embodiments is applied.

FIG. 22 illustrates a state in which an operator (surgeon) 460 performs an operation on a patient 472 on a patient bed 470 using an endoscopic surgical system 400.

As illustrated in FIG. 22, the endoscopic surgical system 400 according to the present embodiment may include an endoscope 410, a surgical tool 420, and a cart 430 on which various devices for endoscopic surgery are mounted. The cart 430 may include a CCU (Camera Control Unit) 432, a light source device 434, an input device 436, a processing tool control device 438, a display device 440, and the like.

The endoscope 410 includes a lens barrel 412 in which an area of a predetermined length from the tip is inserted into the body cavity of the patient 472, and a camera head 414 connected to the base end of the lens barrel 412. Although FIG. 22 illustrates an endoscope 410 configured as a rigid mirror having a rigid lens barrel 412, the endoscope 410 may be configured as a flexible mirror having a flexible lens barrel. The endoscope 410 is held in a movable state by an arm 416.

An opening into which the objective lens is fitted is provided at the tip of the lens barrel 412. A light source device 434 is connected to the endoscope 410, and light generated by the light source device 434 is guided to the tip of the lens barrel 412 by a light guide extended inside the lens barrel 412, and is irradiated to an observation target in the body cavity of the patient 472 via an objective lens. The endoscope 410 may be a direct-viewing mirror, an oblique-viewing mirror, or a side-viewing mirror.

An optical system and a photoelectric conversion device (not illustrated) are provided inside the camera head 414, and reflected light (observation light) from the observation target is focused on the photoelectric conversion device by the optical system. The photoelectric conversion device photoelectrically converts the observation light and generates an electric signal corresponding to the observation light, i.e., an image signal corresponding to the observation image. As the photoelectric conversion device, the photoelectric conversion device 100 described in any of the first to fifth embodiments may be used. The image signal is transmitted to the CCU 432 as RAW data.

The CCU 432 is configured by a CPU (Central Processing Unit), a GPU (Graphics Processing Unit), and the like, and integrally controls the operation of the endoscope 410 and the display device 440. Further, the CCU 432 receives an image signal from the camera head 414, and performs various types of image processing for displaying an image based on the image signal, such as development processing (demosaic processing), on the image signal.

The display device 440 displays an image based on the image signal subjected to the image processing by the CCU 432 under the control of the CCU 432.

The light source device 434 is configured by, for example, a light source such as an LED (Light Emitting Diode), and supplies irradiation light to the endoscope 410 when capturing an image of a surgical part or the like.

Input device 436 is an input interface for the endoscopic surgical system 400. The user may input various kinds of information and instructions to the endoscopic surgical system 400 via the input device 436.

The processing tool control device 438 controls the actuation of the energy processing tool 450 for tissue ablation, incision, blood vessel sealing, etc.

The light source device 434 for supplying the irradiation light to the endoscope 410 when capturing an image of the surgical part may be composed of a white light source composed of, for example, an LED, a laser light source, or a combination thereof. When a white light source is constituted by a combination of RGB laser light sources, since the output intensity and output timing of each color (each wavelength) may be controlled with high accuracy, the white balance of the captured image may be adjusted in the light source device 434. In this case, the observation object is irradiated with the laser light from each of the RGB laser light sources in a time division manner, and the driving of the imaging element of the camera head 414 is controlled in synchronization with the irradiation timing, whereby the images corresponding to the RGB light sources may be captured in a time division manner. According to this method, a color image may be obtained without providing a color filter in the imaging element.

Further, the driving of the light source device 434 may be controlled so as to change the intensity of the output light every predetermined time. By controlling the driving of the imaging element of the camera head 414 in synchronization with the timing of changing the intensity of the light to acquire images in a time-division manner and compositing the images, it is possible to generate an image in a high dynamic range without so-called blocked up shadows and blown out highlights.

The light source device 434 may be configured to be capable of supplying light in a predetermined wavelength band corresponding to the special light observation. In special light observation, for example, wavelength dependency of light absorption in body tissue is utilized. Specifically, a predetermined tissue such as a blood vessel in the surface layer of the mucosa is imaged with high contrast by irradiating light in a narrower band compared to the irradiation light (i.e., white light) during normal observation. Alternatively, in special light observation, fluorescence observation for obtaining an image by fluorescence generated by irradiation with excitation light may be performed. In the fluorescence observation, the body tissue may be irradiated with excitation light to observe fluorescence from the body tissue, or a reagent such as indocyanine green (ICG) may be locally poured into to the body tissue, and the body tissue may be irradiated with excitation light corresponding to the fluorescence wavelength of the reagent to obtain a fluorescence image. The light source device 434 may be configured to supply narrowband light and/or excitation light corresponding to such special light observation.

As described above, according to the present embodiment, by configuring the endoscopic surgical system using the photoelectric conversion devices of the first to fifth embodiments, it is possible to realize an endoscopic surgical system capable of acquiring images of better quality.

Ninth Embodiment

Figure 23A:
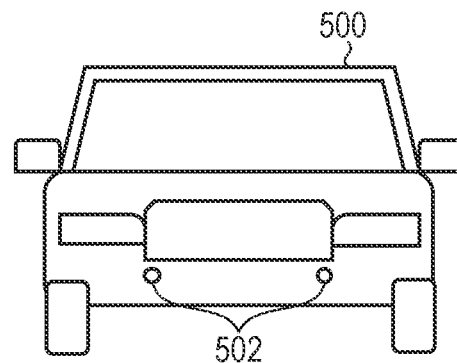
FIG. 23A, FIG. 23B, and FIG. 23C are schematic diagrams illustrating a configuration example of a movable object according to a ninth embodiment of the present invention.
Figure 23B:
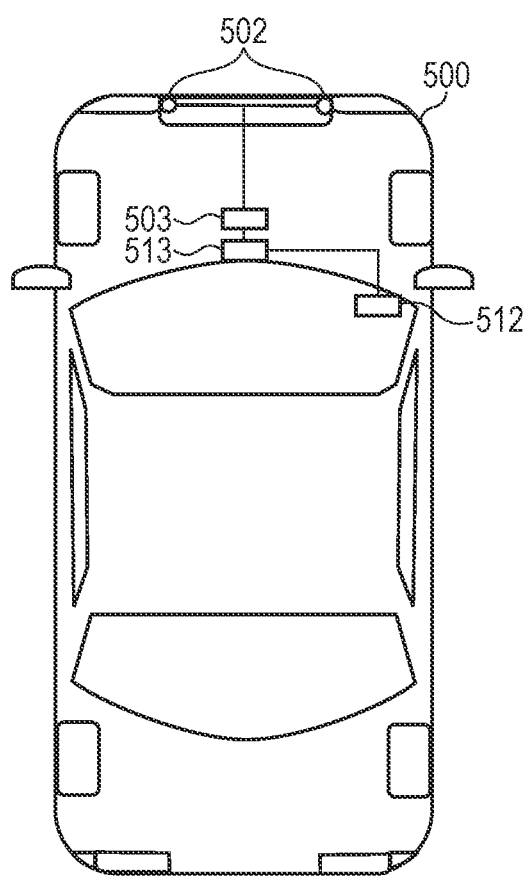
Figure 23C:
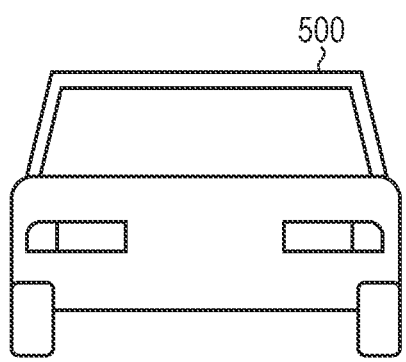
Figure 24:
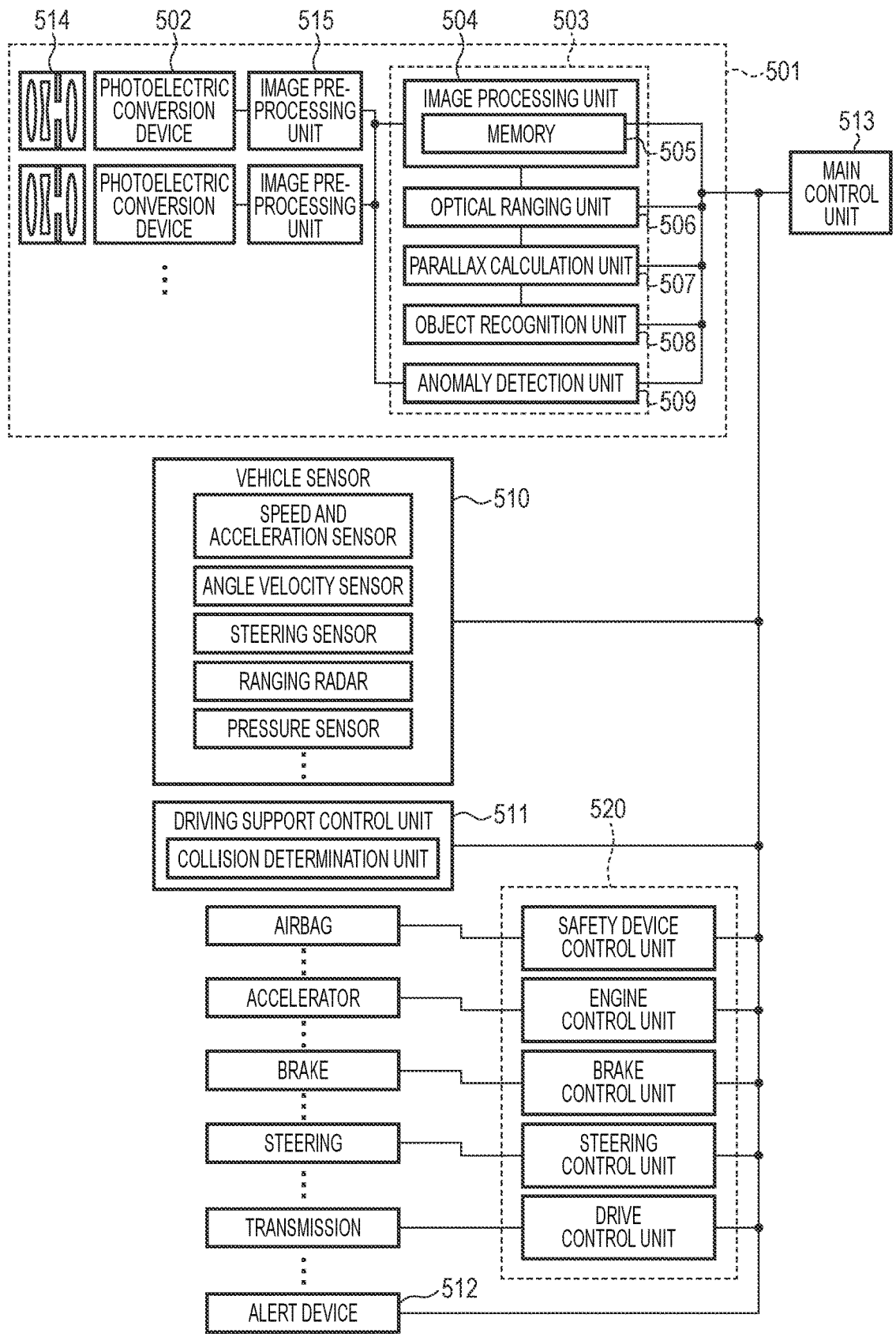
FIG. 24 is a block diagram illustrating a schematic configuration of a photodetection system according to the ninth embodiment of the present invention.

A photodetection system and a movable object according to a ninth embodiment of the present invention will be described with reference to FIG. 23A to FIG. 25. FIG. 23A to FIG. 23C are schematic diagrams illustrating a configuration example of a movable object according to the present embodiment. FIG. 24 is a block diagram illustrating a schematic configuration of a photodetection system according to the present embodiment. FIG. 25 is a flowchart illustrating the operation of the photodetection system according to the present embodiment. In the present embodiment, an application example to an on-vehicle camera will be described as a photodetection system to which the photoelectric conversion device 100 described in any one of the first to fifth embodiments is applied.

FIG. 23A to FIG. 23C are schematic diagrams illustrating a configuration example of a movable object (a vehicle system) according to the present embodiment. FIG. 23A to FIG. 23C illustrate a configuration of a vehicle 500 (an automobile) as an example of a vehicle system incorporating a photodetection system to which the photoelectric conversion device according to any one of the first to fifth embodiments is applied. FIG. 23A is a schematic front view of the vehicle 500, FIG. 23B is a schematic plan view of the vehicle 500, and FIG. 23C is a schematic rear view of the vehicle 500. The vehicle 500 includes a pair of photoelectric conversion devices 502 on the front side thereof. Here, the photoelectric conversion devices 502 are the photoelectric conversion device 100 described in any of the first to fifth embodiments. The vehicle 500 includes an integrated circuit 503, an alert device 512, and a main control unit 513.

FIG. 24 is a block diagram illustrating a configuration example of a photodetection system 501 mounted on the vehicle 500. The photodetection system 501 includes a photoelectric conversion device 502, an image preprocessing unit 515, an integrated circuit 503, and an optical system 514. The photoelectric conversion device 502 is the photoelectric conversion device 100 described in any of the first to fifth embodiments. The optical system 514 forms an optical image of an object on the photoelectric conversion device 502. The photoelectric conversion device 502 converts the optical image of the object formed by the optical system 514 into an electric signal. The image preprocessing unit 515 performs predetermined signal processing on the signal output from the photoelectric conversion device 502. The function of the image preprocessing unit 515 may be incorporated in the photoelectric conversion device 502. The photodetection system 501 is provided with at least two sets of the optical system 514, the photoelectric conversion device 502, and the image preprocessing unit 515, and outputs from the image preprocessing units 515 of each set are input to the integrated circuit 503.

The integrated circuit 503 is an integrated circuit for use in an imaging system, and includes an image processing unit 504, an optical ranging unit 506, a parallax calculation unit 507, an object recognition unit 508, and an abnormality detection unit 509. The image processing unit 504 processes the image signal output from the image preprocessing unit 515. For example, the image processing unit 504 performs image processing such as development processing and defect correction on the output signal of the image preprocessing unit 515. The image processing unit 504 includes a memory 505 for temporarily storing image signals. The memory 505 may store, for example, the position of a known defective pixel in the photoelectric conversion device 502.

The optical ranging unit 506 performs focusing and distance measurement of the object. The parallax calculation unit 507 calculates distance measurement information (distance information) from a plurality of image data (parallax images) acquired by a plurality of photoelectric conversion devices 502. Each of the photoelectric conversion devices 502 may have a configuration capable of acquiring various kinds of information such as distance information. The object recognition unit 508 recognizes an object such as a vehicle, a road, a sign, or a person. When the abnormality detection unit 509 detects an abnormality of the photoelectric conversion device 502, the abnormality detection unit 509 notifies the main control unit 513 of the abnormality.

The integrated circuit 503 may be implemented by dedicated hardware, software modules, or a combination thereof. Further, it may be implemented by FPGA (Field Programmable Gate Array), ASIC (Application Specific Integrated Circuit), or the like, or may be implemented by a combination of these.

The main control unit 513 collectively controls the operations of the photodetection system 501, the vehicle sensor 510, the control unit 520, and the like. The vehicle 500 may not include the main control unit 513. In this case, the photoelectric conversion device 502, the vehicle sensor 510, and the control unit 520 transmit and receive control signals via a communication network. For example, the CAN (Controller Area Network) standard may be applied to transmit and receive the control signals.

The integrated circuit 503 has a function of receiving a control signal from the main control unit 513 or transmitting a control signal and a setting value to the photoelectric conversion device 502 by its own control unit.

The photodetection system 501 is connected to the vehicle sensor 510, and may detect a traveling state of the own vehicle such as a vehicle speed, a yaw rate, a steering angle, and the like, an environment outside the own vehicle, and states of other vehicles and obstacles. The vehicle sensor 510 is also a distance information acquisition means for acquiring distance information to an object. The photodetection system 501 is connected to a driving support control unit 511 that performs various driving support functions such as an automatic steering function, an automatic cruising function, and a collision prevention function. In particular, with regard to the collision determination function, based on the detection results of the photodetection system 501 and the vehicle sensor 510, it is determined whether or not there is a collision with another vehicle or an obstacle. Thus, avoidance control when a collision is estimated and activation of the safety device at the time of collision are performed.

The photodetection system 501 is also connected to an alert device 512 that issues an alert to the driver based on the determination result of the collision determination unit. For example, when the collision possibility is high as the determination result of the collision determination unit, the main control unit 513 performs vehicle control to avoid collision and reduce damage by braking, returning an accelerator, suppressing engine output, or the like. The alert device 512 alerts a user by sounding an alarm such as a sound, displaying alert information on a display screen of a car navigation system or a meter panel, or applying vibration to a seat belt or a steering wheel.

In the present embodiment, the photodetection system 501 images the periphery of the vehicle, for example, the front side or the rear side. FIG. 23B illustrates an example of the arrangement of the photodetection system 501 when the photodetection system 501 captures an image in front of the vehicle.

As described above, the photoelectric conversion device 502 is disposed in front of the vehicle 500. More specifically, when a center line with respect to a forward/backward direction of the vehicle 500 or an outer shape (e.g., a vehicle width) is regarded as a symmetry axis, and two photoelectric conversion devices 502 are disposed axisymmetrically with respect to the symmetry axis, it is preferable to acquire distance information between the vehicle 500 and an object to be imaged and to determine a collision possibility. Further, it is preferable that the photoelectric conversion device 502 is disposed so as not to obstruct the field of view of the driver when the driver sees a situation outside the vehicle 500 from the driver's seat. The alert device 512 is preferably arranged to be easy to enter the field of view of the driver.

Next, a failure detection operation of the photoelectric conversion device 502 in the photodetection system 501 will be described with reference to FIG. 25. The failure detection operation of the photoelectric conversion device 502 may be performed according to steps S110 to S180 illustrated in FIG. 25.

Step S110 is a step of performing setting at the time of startup of the photoelectric conversion device 502. That is, a setting for the operation of the photoelectric conversion device 502 is transmitted from the outside of the photodetection system 501 (for example, the main control unit 513) or from the inside of the photodetection system 501, and the imaging operation and the failure detection operation of the photoelectric conversion device 502 are started.

Next, in step S120, pixel signals are acquired from the effective pixels. In step S130, an output value from the failure detection pixel provided for failure detection is acquired. The failure detection pixel includes a photoelectric conversion element as in the case of the effective pixels. A predetermined voltage is written to the photoelectric conversion element. The failure detection pixel outputs a signal corresponding to the voltage written to the photoelectric conversion element. Step S120 and step S130 may be reversed.

Next, in step S140, a classification of the output expected value of the failure detection pixel and the actual output value from the failure detection pixel is performed. As a result of the classification in step S140, when the output expected value matches the actual output value, the process proceeds to step S150, it is determined that the imaging operation is normally performed, and the process proceeds to step S160. In step S160, the pixel signals of the scanning row are transmitted to the memory 505 to temporarily store them. After that, the process returns to step S120 to continue the failure detection operation. On the other hand, as a result of the classification in step S140, when the output expected value does not match the actual output value, the processing step proceeds to step S170. In step S170, it is determined that there is an abnormality in the imaging operation, and an alert is notified to the main control unit 513 or the alert device 512. The alert device 512 causes the display unit to display that an abnormality has been detected. Thereafter, in step S180, the photoelectric conversion device 502 is stopped, and the operation of the photodetection system 501 is terminated.

Although the present embodiment exemplifies the example in which the flowchart is looped for each row, the flowchart may be looped for each plurality of rows, or the failure detection operation may be performed for each frame. The alert of step S170 may be notified to the outside of the vehicle via the wireless network.

Further, in the present embodiment, the control in which the own vehicle does not collide with other vehicles has been described, but the present invention is also applicable to a control in which the own vehicle is automatically driven following another vehicle, a control in which the own vehicle is automatically driven so as not to go out of the lane, and the like. Further, the photodetection system 501 may be applied not only to a vehicle such as an own vehicle, but also to, for example, other movable objects (moving devices) such as a ship, an aircraft, or an industrial robot. In addition, the present invention may be applied not only to a movable object but also to equipment using object recognition in a wide range such as an intelligent transport system (ITS).

Tenth Embodiment

Figure 26A:
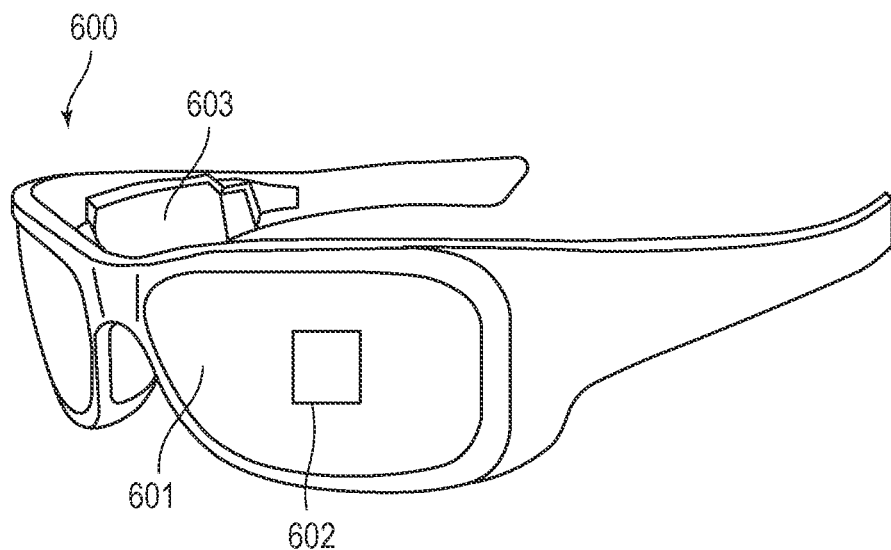
FIG. 26A and FIG. 26B are schematic diagrams illustrating a schematic configuration of a photodetection system according to a tenth embodiment of the present invention.
Figure 26B:
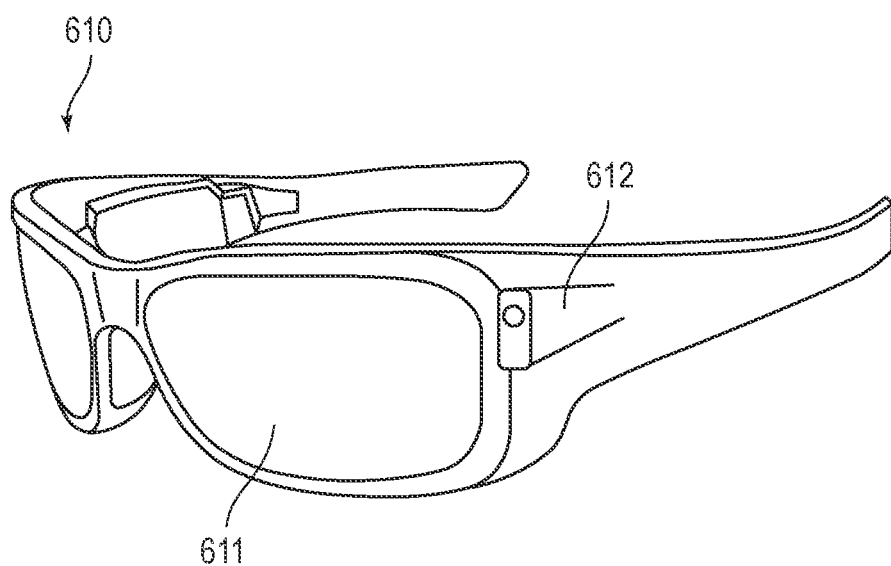

A photodetection system according to a tenth embodiment of the present invention will be described with reference to FIG. 26A and FIG. 26B. FIG. 26A and FIG. 26B are schematic diagrams illustrating a configuration example of a photodetection system according to the present embodiment. In the present embodiment, an application example to eyeglasses (smartglasses) will be described as a photodetection system to which the photoelectric conversion device 100 described in any one of the first to fifth embodiments is applied.

FIG. 26A illustrates eyeglasses 600 (smartglasses) according to one application example. The eyeglasses 600 include lenses 601, a photoelectric conversion device 602, and a control device 603.

The photoelectric conversion device 602 is the photoelectric conversion device 100 described in any of the first to fifth embodiments, and is provided on the lens 601. One photoelectric conversion device 602 or a plurality of photoelectric conversion devices 602 may be provided on the lens 601. When a plurality of photoelectric conversion devices 602 is used, a plurality of types of photoelectric conversion devices 602 may be used in combination. The arrangement position of the photoelectric conversion device 602 is not limited to that illustrated in FIG. 26A. A display device (not illustrated) including a light emitting device such as an OLED or an LED may be provided on the rear surface side of the lens 601.

The control device 603 functions as a power supply for supplying power to the photoelectric conversion device 602 and the display device. The control device 603 has a function of controlling the operations of the photoelectric conversion device 602 and the display device. The lens 601 is provided with an optical system for focusing light on the photoelectric conversion device 602.

FIG. 26B illustrates eyeglasses 610 (smartglasses) according to another application example. The eyeglasses 610 include lenses 611 and a control device 612. A photoelectric conversion device corresponding to the photoelectric conversion device 602 and a display device (not illustrated) may be mounted on the control device 612.

The lens 611 is provided with a photoelectric conversion device in the control device 612 and an optical system for projecting light from the display device, and an image is projected thereon. The control device 612 functions as a power supply for supplying power to the photoelectric conversion device and the display device, and has a function of controlling the operations of the photoelectric conversion device and the display device.

The control device 612 may further include a line-of-sight detection unit that detects the line of sight of the wearer. In this case, an infrared light emitting unit is provided in the control device 612, and infrared light emitted from the infrared light emitting unit may be used for detection of a line of sight. Specifically, the infrared light emitting unit emits infrared light to the eyeball of the user who is watching the display image. The reflected light of the emitted infrared light from the eyeball is detected by the imaging unit having the light receiving element, whereby a captured image of the eyeball is obtained. By providing a reduction unit that reduces light from the infrared light emitting unit to the display unit in a plan view, a decrease in image quality may be reduced.

The line of sight of the user with respect to the display image may be detected from the captured image of the eyeball obtained by capturing the infrared light. Any known method may be applied to the line-of-sight detection using the captured image of the eyeball. As an example, a line-of-sight detection method based on a Purkinje image caused by reflection of irradiation light on the cornea may be used. More specifically, a line-of-sight detection processing based on the pupil cornea reflection method is performed. By using the pupil cornea reflection method, a line-of-sight vector representing the direction (rotation angle) of the eyeball is calculated based on the image of the pupil image and the Purkinje image included in the captured image of the eyeball, whereby the line-of-sight of the user is detected.

The display device according to the present embodiment may include a photoelectric conversion device having a light receiving element, and may be configured to control a display image based on line-of-sight information of a user from the photoelectric conversion device. Specifically, the display device determines a first viewing area to be gazed by the user and a second viewing area other than the first viewing area based on the line-of-sight information. The first viewing area and the second viewing area may be determined by a control device of the display device, or may be determined by an external control device. When an external control device determines, the determination result is transmitted to a display device via communication. In the display region of the display device, the display resolution of the first viewing area may be controlled to be higher than the display resolution of the second viewing area. That is, the resolution of the second viewing area may be lower than the resolution of the first viewing area.

Further, the display area may have a first display area and a second display area different from the first display area, and may be configured to determine an area having a high priority from the first display area and the second display area based on the line-of-sight information. The first display area and the second display area may be determined by a control device of the display device, or may be determined by an external control device. When an external control device determines, the determination result is transmitted to a display device via communication. The resolution of the area with high priority may be controlled to be higher than the resolution of the area other than the area with high priority. That is, the resolution of the area having a relatively low priority may be reduced.

An AI (Artificial Intelligence) may be used to determine the first viewing area or the area with high priority. The AI may be a model configured to estimate an angle of a line of sight and a distance to a target object ahead of the line of sight from an image of an eyeball, using an image of the eyeball and a direction in which the eyeball of the image is actually viewed as teacher data. The AI program may be held by a display device, a photoelectric conversion device, or an external device. When the external device has, the information is transmitted to the display device via communication.

When the display control is performed based on the visual recognition detection, the present invention may be preferably applied to a smartglasses which further include a photoelectric conversion device for capturing an image of the outside. The smartglasses may display captured external information in real time.

Modified Embodiments

The present invention is not limited to the above embodiment, and various modifications are possible.

For example, an example in which some of the configurations of any of the embodiments are added to other embodiments or an example in which some of the configurations of any of the embodiments are substituted with some of the configurations of the other embodiments is also an embodiment of the present invention.

The circuit configuration of the pixel 12 is not limited to the above-described embodiments. For example, a switch such as a transistor may be provided between the photoelectric conversion element 22 and the quenching element 24 or between the photoelectric conversion unit 20 and the pixel signal processing unit 30 to control an electrical connection state therebetween. Further, a switch such as a transistor may be provided between the node to which the voltage VH is supplied and the quenching element 24 and/or between the node to which the voltage VL is supplied and the photoelectric conversion element 22 to control an electrical connection state therebetween.

Although the counter 34 is used as the pixel signal processing unit 30 in the above-described embodiments, a TDC (Time to Digital Converter) and a memory may be used instead of the counter 34. In this case, the generation timing of the pulse signal output from the signal processing circuit 32 is converted into a digital signal by the TDC. A control pulse pREF (reference signal) is supplied from the vertical scanning circuit unit 40 to the TDC via the control line 14 when the timing of the pulse signal is measured. The TDC acquires a signal corresponding to a relative time of the input timing of the signal output from each pixel 12 with respect to the control pulse pREF as a digital signal.

In the above-described embodiments, one pixel 12 includes one photoelectric conversion element 22, but one pixel 12 may include a plurality of photoelectric conversion elements 22. Although one photoelectric conversion element 22 is disposed in one semiconductor region 136 surrounded by the p-type semiconductor regions 132 and 134 in the above-described embodiments, a plurality of photoelectric conversion elements 22 may be disposed in one semiconductor region 136.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-191170, filed Nov. 25, 2021, which is hereby incorporated by reference herein in its entirety.

What is claimed is:

1. A photoelectric conversion element provided in a semiconductor layer having a first surface and a second surface opposed to the first surface comprising:
    a first semiconductor region of a first conductivity type;
    a second semiconductor region of a second conductivity type disposed closer to the second surface than the first semiconductor region and forming a p-n junction with the first semiconductor region;
    a third semiconductor region of the first conductivity type disposed closer to the second surface than the second semiconductor region and overlapping with the first semiconductor region and the second semiconductor region in a plan view;
    a fourth semiconductor region of the second conductivity type disposed closer to the second surface than the third semiconductor region and overlapping with the whole of a region where the first semiconductor region, the second semiconductor region, and the third semiconductor region are disposed in the plan view;
    a fifth semiconductor region of the second conductivity type disposed at a depth between the third semiconductor region and the fourth semiconductor region; and
    a sixth semiconductor region of the second conductivity type disposed so as to surround a region where the first semiconductor region, the second semiconductor region, the third semiconductor region, and the fifth semiconductor region are disposed in the plan view, and electrically connected to the fourth semiconductor region,
    wherein the fifth semiconductor region has an area smaller than an area of the third semiconductor region in the plan view and overlaps with the first semiconductor region in the plan view.

2. The photoelectric conversion element according to claim 1, wherein an end portion of the fifth semiconductor region on a side of the first surface in a cross-sectional view is positioned closer to the first surface than an end portion of the third semiconductor region on a side of the second surface in the cross-sectional view.

3. The photoelectric conversion element according to claim 2, wherein at a depth where the third semiconductor region and the fifth semiconductor region are arranged, a potential of the fifth semiconductor region with respect to a carrier of the first conductivity type is higher than a potential of the third semiconductor region with respect to the carrier of the first conductivity type.

4. The photoelectric conversion element according to claim 1, wherein the third semiconductor region and the fifth semiconductor region form a p-n junction.

5. The photoelectric conversion element according to claim 1 further comprising a seventh semiconductor region of the first conductivity type disposed so as to surround the third semiconductor region at a depth at which the third semiconductor region is provided,
    wherein the seventh semiconductor region extends in a region between the third semiconductor region and the fourth semiconductor region and forms a p-n junction with the fifth semiconductor region.

6. The photoelectric conversion element according to claim 1 further comprising a plurality of eighth semiconductor regions of the second conductivity type arranged at a depth between the third semiconductor region and the fourth semiconductor region,
    wherein the plurality of eighth semiconductor regions is disposed between the fifth semiconductor region and the sixth semiconductor region in the plan view.

7. The photoelectric conversion element according to claim 1, wherein the fifth semiconductor region is in contact with the fourth semiconductor region.

8. The photoelectric conversion element according to claim 1, wherein the fifth semiconductor region is spaced apart from the fourth semiconductor region.

9. The photoelectric conversion element according to claim 1, wherein an impurity concentration of the fifth semiconductor region is lower than an impurity concentration of the fourth semiconductor region and an impurity concentration of the sixth semiconductor region.

10. The photoelectric conversion element according to claim 1, wherein an area of the second semiconductor region in the plan view is larger than an area of the first semiconductor region in the plan view.

11. The photoelectric conversion element according to claim 1, wherein the second semiconductor region is in contact with the sixth semiconductor region.

12. The photoelectric conversion element according to claim 1, wherein the semiconductor layer has a concave-convex structure provided on the second surface.

13. The photoelectric conversion element according to claim 12, wherein the concave-convex structure extends to a depth at which the fifth semiconductor region is disposed.

14. The photoelectric conversion element according to claim 1 further comprising an isolation structure disposed inside the sixth semiconductor region so as to surround the region where the first semiconductor region, the second semiconductor region, the third semiconductor region, and the fifth semiconductor region are disposed in the plan view.

15. The photoelectric conversion element according to claim 1 further comprising a first electrode electrically connected to the first semiconductor region and a second electrode electrically connected to the sixth semiconductor region.

16. The photoelectric conversion element according to claim 1 further comprising an optical structure layer disposed on a side of the second surface of the semiconductor layer.

17. A photoelectric conversion device comprising:
    a plurality of pixels arranged to form a plurality of rows and a plurality of columns,
    wherein each of the plurality of pixels includes the photoelectric conversion element according to claim 1 and a signal processing circuit configured to process a signal output from the photoelectric conversion element.

18. The photoelectric conversion device according to claim 17, wherein an arrangement interval of the plurality of pixels is larger than the thickness of the semiconductor layer.

19. The photoelectric conversion device according to claim 17 further comprising:
    a first substrate including the semiconductor layer provided with the photoelectric conversion element of each of the plurality of pixels; and a second substrate on which the signal processing circuit of each of the plurality of pixels is provided.

20. A photodetection system comprising:
the photoelectric conversion device according to claim 17; and
a signal processing device configured to process a signal output from the photoelectric conversion device.

21. The photodetection system according to claim 20, wherein the signal processing device generates a distance image representing distance information to an object based on the signal.

22. A movable object comprising:
the photoelectric conversion device according to claim 17;
a distance information acquisition unit configured to acquire distance information to an object from a parallax image based on a signal output from the photoelectric conversion device; and
a control unit configured to control the movable object based on the distance information.

* * * * *